United States Patent
Latham et al.

(10) Patent No.: US 10,132,879 B2
(45) Date of Patent: Nov. 20, 2018

(54) GAIN EQUALIZATION FOR MULTIPLE AXIS MAGNETIC FIELD SENSING

(71) Applicant: Allegro Microsystems, LLC, Worcester, MA (US)

(72) Inventors: Alexander Latham, Harvard, MA (US); Craig S. Petrie, Merrimack, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 117 days.

(21) Appl. No.: 15/161,553

(22) Filed: May 23, 2016

(65) Prior Publication Data

US 2017/0336481 A1    Nov. 23, 2017

(51) Int. Cl.
| | |
|---|---|
| G01R 33/06 | (2006.01) |
| G01R 33/07 | (2006.01) |
| G01R 33/09 | (2006.01) |
| G01R 35/00 | (2006.01) |
| G01D 5/14 | (2006.01) |

(52) U.S. Cl.
CPC ........... *G01R 33/077* (2013.01); *G01D 5/147* (2013.01); *G01R 35/005* (2013.01)

(58) Field of Classification Search
CPC .... G01R 33/077; G01R 33/07; G01R 33/072; G01R 33/075; G01R 33/09; G01R 33/091; G01R 33/093; G01R 33/095; G01R 33/096; G01R 33/098; G01R 33/06; G01R 33/0206; G01R 33/028; G01R 33/1215; G01R 33/02; G01R 33/022; G01R 33/025; G01R 33/0017; G01R 35/005; G01D 5/142; G01D 5/145; G01D 5/1477

USPC ...... 324/251, 207.12, 207.13, 207.14, 207.2, 324/207.21, 117 H

See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |
| 4,752,733 A | 6/1988 | Petr et al. | |
| 4,760,285 A | 7/1988 | Nelson | |
| 4,823,075 A | 4/1989 | Alley | |

(Continued)

FOREIGN PATENT DOCUMENTS

| | | |
|---|---|---|
| DE | 195 39 458 A1 | 4/1997 |
| DE | 10 2004 017 191 A1 | 10/2005 |

(Continued)

OTHER PUBLICATIONS

Letter from Japanese Associate dated Sep. 27, 2016 indicating Notice of Appeal flied in Japan and Current Claims dated Aug. 29, 2016; for Japanese Patent Application No. 2015-013206; 3 pages.

(Continued)

*Primary Examiner* — Lee Rodak
(74) *Attorney, Agent, or Firm* — Daly Crowley Mofford & Durkee LLP

(57) ABSTRACT

A magnetic field sensor for sensing external magnetic fields on multiple axes comprises a coil structure and a gain equalization circuit. The coil structure generates reference fields on magnetic field sensing elements in each axis. The gain equalization circuit measures and compares reference fields to generate gain-equalized output signals responsive to the external magnetic fields.

19 Claims, 9 Drawing Sheets

(56) References Cited

U.S. PATENT DOCUMENTS

| | | |
|---|---|---|
| 4,833,406 A | 5/1989 | Foster |
| 4,970,411 A | 11/1990 | Halg et al. |
| 5,247,278 A | 9/1993 | Pant et al. |
| 5,285,155 A | 2/1994 | Ueda et al. |
| 5,329,416 A | 7/1994 | Ushiyama et al. |
| 5,412,255 A | 5/1995 | Wallrafen |
| 5,469,058 A | 11/1995 | Dunnam |
| 5,521,501 A | 5/1996 | Dettmann et al. |
| 5,621,319 A | 4/1997 | Bilotti et al. |
| 5,640,090 A | 6/1997 | Furuya et al. |
| 6,436,748 B1 | 8/2002 | Forbes et al. |
| 6,437,558 B2 | 8/2002 | Li et al. |
| 6,853,178 B2 | 2/2005 | Hayat-Dawoodi |
| 6,896,407 B2 | 5/2005 | Nomiyama et al. |
| 7,038,448 B2 | 5/2006 | Schott et al. |
| 7,259,545 B2 | 8/2007 | Stauth et al. |
| 7,474,093 B2 | 1/2009 | Ausserlechner |
| 7,518,354 B2 | 4/2009 | Stauth et al. |
| 7,746,056 B2 | 6/2010 | Stauth et al. |
| 7,923,996 B2 | 4/2011 | Doogue et al. |
| 8,030,918 B2 | 10/2011 | Doogue et al. |
| 8,447,556 B2 | 5/2013 | Friedrich et al. |
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,818,749 B2 | 8/2014 | Friedrich et al. |
| 9,099,638 B2 | 8/2015 | Wang et al. |
| 9,116,195 B2* | 8/2015 | Yamashita .............. G01R 33/07 |
| 9,151,807 B2 | 10/2015 | Friedrich et al. |
| 9,201,122 B2 | 12/2015 | Cesaretti et al. |
| 2003/0151406 A1 | 8/2003 | Wan et al. |
| 2005/0258820 A1 | 11/2005 | Forster |
| 2006/0164080 A1* | 7/2006 | Popovic .................. G01R 33/04 |
| | | 324/244 |
| 2006/0202692 A1 | 9/2006 | Tatschl et al. |
| 2007/0247141 A1 | 10/2007 | Pastre et al. |
| 2009/0001964 A1 | 1/2009 | Strzalkowski |
| 2009/0085706 A1 | 4/2009 | Baarman et al. |
| 2011/0031960 A1* | 2/2011 | Hohe ................ G01R 33/0017 |
| | | 324/202 |
| 2011/0119015 A1 | 5/2011 | Hirobe et al. |
| 2011/0304325 A1 | 12/2011 | Walther et al. |
| 2012/0016614 A1* | 1/2012 | Hohe ................ G01R 33/0017 |
| | | 702/85 |
| 2012/0217960 A1 | 8/2012 | Ausserlechner |
| 2012/0274314 A1 | 11/2012 | Cesaretti et al. |
| 2013/0057256 A1* | 3/2013 | Ernst .................. G01R 33/0005 |
| | | 324/202 |
| 2013/0057276 A1 | 3/2013 | Klein |
| 2014/0210023 A1 | 7/2014 | Wang |
| 2014/0347044 A1* | 11/2014 | Monreal ................ G01R 33/07 |
| | | 324/251 |
| 2015/0008913 A1* | 1/2015 | Fu ........................ G01R 33/096 |
| | | 324/252 |
| 2015/0022192 A1 | 1/2015 | Ausserlechner |
| 2015/0301149 A1 | 10/2015 | Cesaretti et al. |
| 2015/0345990 A1 | 12/2015 | David et al. |
| 2015/0354985 A1 | 12/2015 | Judkins, III et al. |
| 2016/0139229 A1* | 5/2016 | Petrie ..................... G01R 33/09 |
| | | 324/202 |
| 2016/0139230 A1 | 5/2016 | Petrie et al. |

FOREIGN PATENT DOCUMENTS

| | | |
|---|---|---|
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 1 637 898 A1 | 3/2006 |
| EP | 1637898 | 3/2006 |
| EP | 1 679 524 A1 | 7/2006 |
| EP | 1 850 143 A1 | 10/2007 |
| GB | 2 276 727 A | 10/1994 |
| JP | S 63-11675 Y2 | 4/1988 |
| JP | 03-248611 | 11/1991 |
| JP | H06148777 | 5/1994 |
| JP | 2000-055999 | 2/2000 |
| JP | 2002-213992 | 7/2002 |
| JP | 2004/177228 | 6/2004 |
| JP | 2004-234589 | 8/2004 |
| JP | 2006-126012 | 5/2006 |
| JP | A 2006126012 A | 5/2006 |
| JP | 2008-513762 | 5/2008 |
| KR | 10-2007-0060096 | 6/2007 |
| WO | WO 9602849 A1 | 2/1996 |
| WO | WO 2004/072672 | 8/2004 |
| WO | WO 2006/056829 | 6/2006 |
| WO | WO 2007/138508 | 12/2007 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2010-097677 | 9/2010 |
| WO | WO 2016-077065 | 5/2016 |
| WO | WO 2016-077066 | 5/2016 |

OTHER PUBLICATIONS

"CMOS-Based Monolithic Controllers for Smart Sensors Comprising Micromembranes and Microcantilevers", Barrettino et al.; IEEE Transaction on Circuits and Systems—I. Regular Papers., vol. 54, No. 1, Jan. 2007, 12 pages.

Government of India, Patent Office Examination Report dated Mar. 6, 2017, 8 pages.

Allowed claims filed on Jun. 5, 2017 for JP Pat. Appl. No. 2015-013206; 2 pages.

Search Report and Written Opinion dated Oct. 4, 2017 for PCT Application No. PCT/US2017/029588; 23 pages.

Letter from Yuasa and Hara dated Dec. 14, 2016 regarding Appeal for JP Pat Appl. No. 2015-013206; 3 pages.

Translation of Current Claims on file (as amended on Aug. 29, 2016) for JP 2015-013206; 2 pages.

Invitation to pay fees and Partial Search Report dated Jul. 10, 2017 for PCT Application No. PCT/US2017/029588, 15 pages.

Allegro MicroSystems, LLC, "Programmable Linear Hall with Advanced Diagnostics;" A1342 Preliminary Design Intent Datasheet; Revision 2.0 JJL; 44 Pages.

Ausserlechner et al., "Compensation of the Piezo-Hall Effect in Integrated Hall Sensors on (100)-Si;" IEEE Sensors Journal, vol. 7, No. 11; Nov. 2007; pp. 1475-1482; 8 Pages.

Ausserlechner et al., "Drift of Magnetic Sensitivity of Smart Hall Sensors Due to Moisture Absorbed by the IC-Package;" Proceedings of IEEE Sensors Conference, vol. 1; Oct. 24, 2004; pp. 455-458; 4 Pages.

Ausserlechner, "Limits of Offset Cancellation by the Principle of Spinning Current Hall Probe;" Proceedings of IEEE Sensors Conference; Oct. 24, 2004; pp. 1117-1120; 4 Pages.

Ausserlechner, "The piezo-Hall effect in n-silicon for arbitrary crystal orientation;" Proceedings of IEEE Sensors Conference, vol. 3; Oct. 24, 2004; pp. 1149-1152; 4 Pages.

Bahreyni et al., "A Resonant Micromachined Magnetic Field Sensor;" IEEE Sensors Journal, vol. 7, No. 9, Sep. 2007; pp. 1326-1334; 9 Pages.

Barrettino et al., "CMOS-Based Monolithic Controllers for Smart Sensors Comprising Micromembranes and Microcantilevers;" IEEE Transactions on Circuits and Systems-1: Regular Papers, vol. 54, No. 1; Jan. 2007; pp. 141-152; 12 Pages.

Baschirotto et al., "Development and Analysis of a PCB Vector 2-D Magnetic Field Sensor System for Electronic Compasses;" IEEE Sensors Journal, vol. 6, No. 2; Apr. 2006; pp. 365-371; 7 Pages.

Bilotti et al., "Monolithic Magnetic Hall Sensor Using Dynamic Quadrature Offset Cancellation;" Technical Paper STP 97-10: Product Description; IEEE Journal of Solid-State Circuits;, vol. 32, Issue 6; Jun. 1997; pp. 829-836; 8 Pages.

Demierre et al., "Reference Magnetic Actuator for Self-Calibration of a Very Small Hall Sensor Array;" Sensors and Actuators A 97-98; Apr. 2002; pp. 39-46; 8 Pages.

(56) References Cited

OTHER PUBLICATIONS

Frick et al., "CMOS Microsystem for AC Current Measurement with Galvanic Isolation;" IEEE Sensors Journal, vol. 3, No. 6; Dec. 2003; pp. 752-760; 9 Pages.
Hosticka, "CMOS Sensor Systems;" Sensors and Actuators A 66; Apr. 1998; pp. 335-341; 7 Pages.
Halg, "Piezo-Hall Coefficients of n-Type Silicon;" Journal of Applied Physics, vol. 64, No. 1; Jul. 1, 1988; pp. 276-282; 7 Pages.
Judkins III et al., "Magnetic Field Sensor to Detect a Magnitude of a Magnetic Field in Any Direction;" U.S. Patent Application and Drawings filed on Aug. 19, 2015 and assigned as U.S. Appl. No. 14/830,098; 51 Pages.
Kammerer et al., "A Hall effect sensors network insensitive to mechanical stress;" Proceedings of IEEE Sensors, vol. 3; Oct. 2004; pp. 1071-1074; 4 Pages.
Kanda et al., "The Piezo-Hall Effect in n-Silicon;" Proceedings of the $22^{nd}$ International Conference on the Physics of Semiconductors, vol. 1; Jan. 1995; pp. 89-92; 4 Pages.
Magnani et al., "Mechanical Stress Measurement Electronics Based on Piezo-Resistive and Piezo-Hall Effects;" Proceedings of the $9^{th}$ International Conference on Electronics, Circuits and Systems, vol. 1; Dec. 2002; pp. 363-366; 4 Pages.
Manic, "Drift in Silicon Integrated Sensors and Circuits Due to the Thermo-Mechanical Stresses;" Lausanne, École Polytechnique Fédérale De Lausanne 2000; Part 1 of 2; 74 Pages.
Manic, "Drift in Silicon Integrated Sensors and Circuits Due to the Thermo-Mechanical Stresses;" Lausanne, École Polytechnique Fédérale De Lausanne 2000; Part 2 of 2; 102 Pages.
Manic et al., "Short and Long-Term Stability Problems of Hall Plates in Plastic Packages;" IEEE $38^{th}$ Annual International Reliability Physics Symposium; Apr. 2000; pp. 225-230; 6 Pages.
Motz et al., "A Chopped Hall Sensor with Small Jitter and Programmable "True Power-On" Function;" IEEE Journal of Solid-State Circuits, vol. 40, No. 7; Jul. 2005; pp. 1533-1540; 8 Pages.
Motz et al., "An Integrated Hall Sensor Platform Design for Position, Angle and Current Sensing;" IEEE Sensors 2006; Oct. 22-25, 2006; pp. 1008-1011; 4 Pages.
Motz et al., "An Integrated Magnetic Sensor with Two Continuous-Time $\Delta\Sigma$-Converters and Stress Compensation Capability;" IEEE International Solid-State Circuits Conference; Digest of Technical Papers; Feb. 6, 2006; pp. 1151-1160; 7 Pages.
Munter, "A Low-offset Spinning-current Hall Plate;" Sensors and Actuators A21-A23; Jan. 1990; pp. 743-746; 4 Pages.
Munter, "Electronic Circuitry for a Smart Spinning-current Hall Plate with Low Offset;" Sensors and Actuators A 25-27; Jun. 1991; pp. 747-751; 5 Pages.
Partin et al., "Temperature Stable Hall Effect Sensors;" IEEE Sensors Journal, vol. 6, No. 1; Feb. 2006; pp. 106-110; 5 Pages.
Pastre et al., "A Hall Sensor Analog Front End for Current Measurement with Continuous Gain Calibration;" IEEE Sensors Journal, vol. 7, No. 5; May 2007; pp. 860-867; 8 Pages.
Pastre et al., "A Hall Sensor-Based Current Measurement Microsystem With Continuous Gain Calibration;" Proceedings of IEEE Research in Microelectronics and Electronics, vol. 2; Jul. 25, 2005; pp. 95-98; 4 Pages.
Popovic, "Sensor Microsystems;" Proceedings of the $20^{th}$ International Conference on Microelectronics (MIEL 95), vol. 2; Sep. 12-14, 1995; pp. 531-537; 7 Pages.
Randhawa, "Monolithic Integrated Hall Devices in Silicon Circuits;" Microelectronics Journal, vol. 12, No. 6; Sep. 14-17, 1981; pp. 24-29; 6 Pages.
Ruther et al., "Integrated CMOS-Based Sensor Array for Mechanical Stress Mapping;" $5^{th}$ IEEE Sensors Conference; Oct. 22-25, 2007; pp. 1131-1134; 4 Pages.
Ruther et al., "Thermomagnetic Residual Offset in Integrated Hall Plates;" IEEE Sensors Journal, vol. 3, No. 6; Dec. 2003; pp. 693-699; 7 Pages.
Schneider et al., "Temperature Calibration of CMOS Magnetic Vector Probe for Contactless Angle Measurement System;" Proceedings of the 1996 IEEE; Jan. 1996; pp. 533-536; 4 Pages.
Schott et al., "CMOS Single-Chip Electronic Compass with Microcontroller;" IEEE Journal of Solid-State Circuits, vol. 42, No. 12; Dec. 2007; pp. 2923-2933; 11 Pages.
Schott et al., "Linearizing Integrated Hall Devices;" International Conference on Solid-State Sensors and Actuators (Transducers '97); Jun. 16-19, 1997; pp. 393-396; 4 Pages.
Simon et al., "Autocalibration of Silicon Hall Devices;" $8^{th}$ International Conference on Solid-State Sensors and Actuators, and Eurosensors IX (Transducers '95—Eurosensors IX), vol. 2; Jun. 25-29, 1995; pp. 237-240; 4 Pages.
Steiner et al., "Double-Hall Sensor with Self-Compensated Offset;" International Electron Devices Meeting (IEDM); Dec. 7, 1997; pp. 911-914; 4 Pages.
Steiner et al, "Offset Reduction in Hall Devices by Continuous Spinning Current Method;" Sensors and Actuators A 66; Jan. 1998; pp. 167-172; 6 Pages.
Stellrecht et al., "Characterization of Hygroscopic Swelling Behavior of Mold Compounds and Plastic Packages;" IEEE Transactions on Components and Packaging Technologies, vol. 27, No. 3; Sep. 2004; pp. 499-506; 8 Pages.
Tian et al., "Multiple Sensors on Pulsed Eddy-Current Detection for 3-D Subsurface Crack Assessment;" IEEE Sensors Journal, vol. 5, No. 1; Feb. 2005; pp. 90-96; 7 Pages.
Trontelj et al, "CMOS Integrated Magnetic Field Source Used as a Reference in Magnetic Field Sensors on Common Substrate;" Proceedings of IMTC Conference; May 10-12, 1994; pp. 461-463; 3 Pages.
Zou et al., "Three-Dimensional Die Surface Stress Measurements in Delaminated and Non-Delaminated Plastic Packages;" 48th Electronic Components and Technology Conference; May 25, 1998; pp. 1223-1234; 12 Pages.
Restriction Requirement dated May 14, 2010 for U.S. Appl. No. 12/037,393; 6 Pages.
Response to Restriction Requirement dated May 14, 2010 for U.S. Appl. No. 12/037,393; Response filed on Jun. 2, 2010; 1 Pages.
Office Action dated Jun. 30, 2010 for U.S. Appl. No. 12/037,393; 21 Pages.
Response to Office Action dated Jun. 30, 2010 for U.S. Appl. No. 12/037,393; Response filed on Oct. 14, 2010; 34 Pages.
Notice of Allowance dated Nov. 3, 2010 for U.S. Appl. No. 12/037,393; 7 Pages.
Second Notice of Allowance dated Feb. 11, 2011 for U.S. Appl. No. 12/037,393; 8 Pages.
Office Action dated Feb. 2, 2011 for U.S. Appl. No. 12/959,672; 13 Pages.
Response to Office Action dated Feb. 2, 2011 for U.S. Appl. No. 12/959,672; Response filed on May 24, 2011; 8 Pages.
Notice of Allowance dated Jun. 27, 2011 for U.S. Appl. No. 12/959,672; 8 Pages.
Second Notice of Allowance dated Jul. 19, 2011 for U.S. Appl. No. 12/959,672; 8 Pages.
PCT International Search Report and Written Opinion dated Oct. 23, 2009 for International Application No. PCT/US2009/031776; 16 Pages.
PCT International Preliminary Report dated Sep. 10, 2010 for International Application No. PCT/US2009/031776; 10 Pages.
PCT International Search Report and Written Opinion dated Aug. 11, 2010 for International Application No. PCT/US2010/024256; 14 Pages.
PCT International Preliminary Report dated Sep. 1, 2011 for International Application No. PCT/US2010/024256; 9 Pages.
Korean Office Action (with English Translation) dated Sep. 30, 2013 corresponding to Korean Application No. 10-2010-7019498; 10 Pages.
Response (w/English Translation) to Korean Office Action dated Sep. 30, 2013 corresponding to Korean Application No. 10-2010-7019498; Response filed on Dec. 1, 2014; 32 Pages.
Korean Notice of Allowance (w/English Translation) dated Apr. 20, 2015 corresponding to Korean Application No. 10-2010-7019498; 3 Pages.
Japanese Office Action (English Translation Only) dated Apr. 4, 2013 corresponding to Japanese Application No. 2010-547666; 4 Pages.

(56) References Cited

OTHER PUBLICATIONS

Response (w/Reporting Letter) to Japanese Office Action dated Apr. 4, 2013 corresponding to Japanese Application No. 2010-547666; Response filed on Jul. 3, 2013; 8 Pages.
Japanese $2^{nd}$ Office Action (English Translation Only) dated Nov. 28, 2013 corresponding to Japanese Application No. 2010-547666; 2 Pages.
Response (w/Reporting Letter) to Japanese $2^{nd}$ Office Action dated Nov. 28, 2013 corresponding to Japanese Application No. 2010-547666; Response filed on Feb. 28, 2014; 12 Pages.
Japanese $3^{rd}$ Office Action (w/English Translation) dated Sep. 29, 2014 corresponding to Japanese Application No. 2010-547666; 8 Pages.
Response (w/Reporting Letter) to Japanese $3^{rd}$ Office Action dated Sep. 29, 2014 corresponding to Japanese Application No. 2010-547666; Response filed on Jan. 27, 2015; 6 Pages.
Japanese Notice of Allowance (w/Reporting Letter & Allowed Claims in English) dated May 25, 2015 corresponding to Japanese Application No. 2010-547666; 9 Pages.
Chinese Office Action (w/English Translation) dated Aug. 29, 2012 corresponding to Chinese Application No. 200980106535.4; 8 Pages.
Response (w/Reporting Letter) to Chinese Office Action dated Aug. 29, 2012 corresponding to Chinese Application No. 200980106535.4; Response filed on Jan. 19, 2013; 13 Pages.
Chinese $2^{nd}$ Office Action (w/English Translation) dated Apr. 15, 2013 corresponding to Chinese Application No. 200980106535.4; 9 Pages.
Response (w/Reporting Letter) to Chinese $2^{nd}$ Office Action dated Apr. 15, 2013 corresponding to Chinese Application No. 200980106535.4; Response filed on Jul. 11, 2013; 13 Pages.
Chinese $3^{rd}$ Office Action (w/English Translation) dated Nov. 7, 2013 corresponding to Chinese Application No. 200980106535.4; 9 Pages.
Response (w/Reporting Letter) to Chinese $3^{rd}$ Office Action dated Nov. 7, 2013 corresponding to Chinese Application No. 200980106535.4; Response filed on Jan. 7, 2014; 11 Pages.
Chinese Notice of Allowance (w/English Translation) dated Mar. 7, 2014 corresponding to Chinese Application No. 200980106535.4; 8 Pages.
Korean Office Action (w/English Translation) dated Jan. 30, 2015 corresponding to Korean Application No. 10-2014-7033792; 6 Pages.
Response (w/English Translation) to Korean Office Action dated Jan. 30, 2015 corresponding to Korean Application No. 10-2014-7033792; Response filed on Mar. 23, 2015; 11 Pages.
Korean Notice of Allowance (w/English Translation) dated Jul. 31, 2015 corresponding to Korean Application No. 10-2014-7033792; 5 Pages.
Letter from Shardul Amarchand Mangaldas dated Sep. 15, 2017 for Indian Pat. Appl. No. 2318/KOLNP/2010; 1 page.
Response to the First Examination Report filed on Sep. 6, 2017 for Indian Pat. Appl. No. 2318/KOLNP/2010; 37 pages.
English Translation of Report of Re-Examination before Appeal dated Nov. 28, 2016 for JP Appl. No. 2015-013206; 3 pages.
Letter to Yuasa and Hara dated Feb. 17, 2017 for JP Pat. Appli. No. 2015-013206; 3 pages.

\* cited by examiner

GAIN EQUALIZATION FOR MULTIPLE AXIS MAGNETIC FIELD SENSING

FIELD OF THE INVENTION

This disclosure relates generally to magnetic field sensors and, more particularly, to magnetic field sensors having circuitry to sense and adjust a sensitivity of the magnetic field sensors to a magnetic field.

BACKGROUND

Magnetic field sensors employ a variety of types of magnetic field sensing elements, for example, Hall effect elements and magnetoresistance elements, often coupled to a variety of electronics, all supported by a common substrate. Some magnetic field sensors (referred to herein as "two-dimensional" or "2D" magnetic field sensors) can sense magnetic fields in two different axes. Other magnetic field sensors (referred to herein as "three-dimensional" or "3D" magnetic field sensors) can sense magnetic fields in three different axes.

A magnetic field sensing element (and a magnetic field sensor) can be characterized by a variety of performance characteristics, one of which is a sensitivity, which can be expressed in terms of an output signal amplitude versus a magnetic field to which the magnetic field sensing element is exposed. The sensitivity of a magnetic field sensing element, and therefore, of a magnetic field sensor, is known to change in relation to a number of parameters. For example, the sensitivity can change in relation to a change in temperature of the magnetic field sensing element. As another example, the sensitivity can change in relation to a mechanical stress (or "strain") imposed upon the substrate supporting the magnetic field sensing element. Such stress can be imposed upon the substrate at the time of manufacture of an integrated circuit containing the substrate. For example, the strain can be imposed by stresses caused by curing of molding compounds used to form an encapsulation of the substrate, e.g., a plastic encapsulation.

It may be desirable to keep the gain of a magnetic field sensing element (or magnetic field sensor) constant over changes in temperature, mechanical stress, and other phenomena that may affect sensitivity. It is known to adjust the absolute gain of a magnetic field sensing element by applying a reference field and comparing the output signal amplitude to the known input magnetic field. To apply a reference field, a current may be passed through a coil that is located about the sensing element. If the current going into the coil is highly accurate over temperature, stress, etc., the absolute gain of the sensing element may be kept generally invariant. Moreover, it may be necessary to trim the current drive into the coil in order to maintain highly accurate absolute gain. Examples of using coil-generated reference fields with magnetic field sensors are described in U.S. Pat. Nos. 7,923,996, 8,447,556, and 9,201,122, each of which is incorporated by reference herein in its entirety.

SUMMARY

In some applications that require 2D or 3D sensing—including so-called "slide-by" applications—gain equalization may be as important, or even more important, than maintaining constant absolute gain of magnetic field sensing elements.

According to embodiments of the disclosure, a 2D or 3D magnetic field sensor may include a coil structure to generate a magnetic field on magnetic field sensing elements configured to sense fields in multiple respective axes. The coil structure can be used to equalize the gains of the magnetic field sensing elements. By forcing current through the coil and monitoring the outputs of each sensing element, the ratio of the gains of the sensing elements can be determined. The measured gain ratios can be compared with reference gain ratios (e.g., ratios fixed by the geometry of the magnetic field sensor structure) and the result of the comparison used to adjust the gain of the sensing elements or of the resulting magnetic field signals to equalize gain. This process can be repeated over time to maintain gain equalization in the presence of temperature, mechanical stress, and other phenomena that may affect sensitivity.

In some embodiments, the current drive into the coil does not have to be trimmed in order to keep the gains equalized.

According to one aspect of the disclosure, a structure for multiple axis magnetic field sensing comprises: a plurality of magnetic field sensing elements including a first magnetic field sensing element arranged to have a maximum response to a magnetic field along a first axis, and a second magnetic field sensing element arranged to have a maximum response to the magnetic field along a second axis; and a coil structure configured to generate magnetic fields on each of the plurality of magnetic field sensing elements when a current passes through the coil structure.

In some embodiments, the first and second magnetic field sensing elements comprise vertical Hall effect elements. In certain embodiments, first magnetic field sensing element comprises a planar Hall effect element and the second magnetic field sensing element comprises a vertical Hall effect element. In some embodiments, at least one of the plurality of magnetic field sensing elements comprises a magnetoresistance element.

In particular embodiments, the plurality of magnetic field sensing elements further includes a third magnetic field sensing element arranged to have a maximum response to the magnetic field along a third axis. In some embodiments, the first magnetic field sensing element comprises a planar Hall effect element, and the second and third magnetic field sensing elements comprise vertical Hall effect elements.

In various embodiments, first magnetic field sensing element comprises a first differential magnetic field sensing element and the second magnetic field sensing element comprises a second differential magnetic field sensing element. The coil structure may be configured to generate differential magnetic fields on the first and second differential magnetic field sensing elements. In some embodiments, the first differential magnetic field sensing element comprises two vertical Hall elements and the second differential magnetic field sensing element comprises two vertical Hall elements. In certain embodiments, the first differential magnetic field sensing element comprises two planar Hall elements and the second differential magnetic field sensing element comprises two vertical Hall elements.

In particular embodiments, the plurality of magnetic field sensing elements further includes a third magnetic field sensing element arranged to have a maximum response to the magnetic field along a third axis, wherein the third magnetic field sensing element comprises a third differential magnetic field sensing element. In some embodiments, the first differential magnetic field sensing element comprises two planar Hall effect elements, the second differential magnetic field sensing element comprises two vertical Hall effect elements, and the third differential magnetic field sensing element comprises two vertical Hall effect elements. In various embodiments, the coil structure comprises windings a first direction around the a first one of the two planar Hall effect elements and windings in a second opposite direction around a second one of the two planar Hall effect elements.

In some embodiment, the coil structure comprises a continuous length of conductive material. In certain embodiments, the coil structure comprises multiple coils each configured to generate a magnetic field on one or more of the magnetic field sensing elements when a current passes through the coil. The currents passing through the multiple coils may be matched. In particular embodiments, the multiple coils are coupled in series.

In some embodiments, the coil structure is configured to generate a first magnetic field substantially parallel to the first axis and a second magnetic field substantially parallel to the second axis.

According to another aspect of the disclosure, a magnetic field sensor comprises: a plurality of magnetic field sensing elements; a coil driver configured to generate a coil drive signal; a coil structure coupled to the coil driver and configured to generate a reference magnetic field on each of the plurality of magnetic field sensing elements in response to the coil drive signal, wherein each of the plurality of magnetic field sensing elements is configured to generate an output signal responsive to the respective reference magnetic field and to external magnetic fields; a memory configured to store reference gains associated with the plurality of magnetic field sensing elements; and a gain equalization circuit having inputs coupled to outputs of the plurality of magnetic field sensing elements and a plurality of outputs, the gain equalization circuit configured to extract a reference signal and an external signal from each of the plurality of magnetic field sensing element output signals, to measure a gain of each of the plurality of reference signals, to compare the measured gains to the reference gains, and to adjust the gain of the external signals based on the comparing. In some embodiments, the sensor further comprises a circuit to adjust gains of the external signals in response to the gain adjustment signals.

In certain embodiments, the coil driver is configured to generate a coil drive signal as an alternating current (AC) signal having a frequency substantially different than a frequency associated with the external magnetic fields. The gain equalization circuit may include an external signal filter to extract the external signals from the plurality of magnetic field sensing element output signals and a reference signal filter to extract the reference signals from the plurality of magnetic field sensing element output signals.

In some embodiments, the plurality of magnetic field sensing elements comprises a plurality of differential magnetic field sensing elements, wherein the coil structure is configured to generate a differential reference magnetic field on each of the plurality of magnetic field sensing elements. The magnetic field sensor may further include a plurality of differential output switches each configured to couple outputs of a respective one of the differential magnetic field sensing elements in multiple different configurations.

In particular embodiments, at least one of the differential output switches is configured to couple the outputs of the respective differential magnetic field sensing element in a first configuration and in a second configuration, wherein in the first configuration, the differential magnetic field sensing element outputs are responsive to the external magnetic fields but not the respective differential reference magnetic field, and wherein in the second configuration, the differential magnetic field sensing element outputs are responsive to the respective differential reference magnetic field but not the external magnetic fields. In some embodiments, the sensor further includes a timing circuit to repeatedly alternate between the first configuration and the second configuration.

In various embodiments, the coil structure comprises multiple coils coupled to the coil driver to receive matched currents.

BRIEF DESCRIPTION OF THE DRAWINGS

The concepts, structures, and techniques sought to be protected herein may be more fully understood from the following detailed description of the drawings, in which:

FIG. 3A is a diagram of a structure having two magnetic field sensing elements and a coil structure, according to another embodiment;

Figure 1:
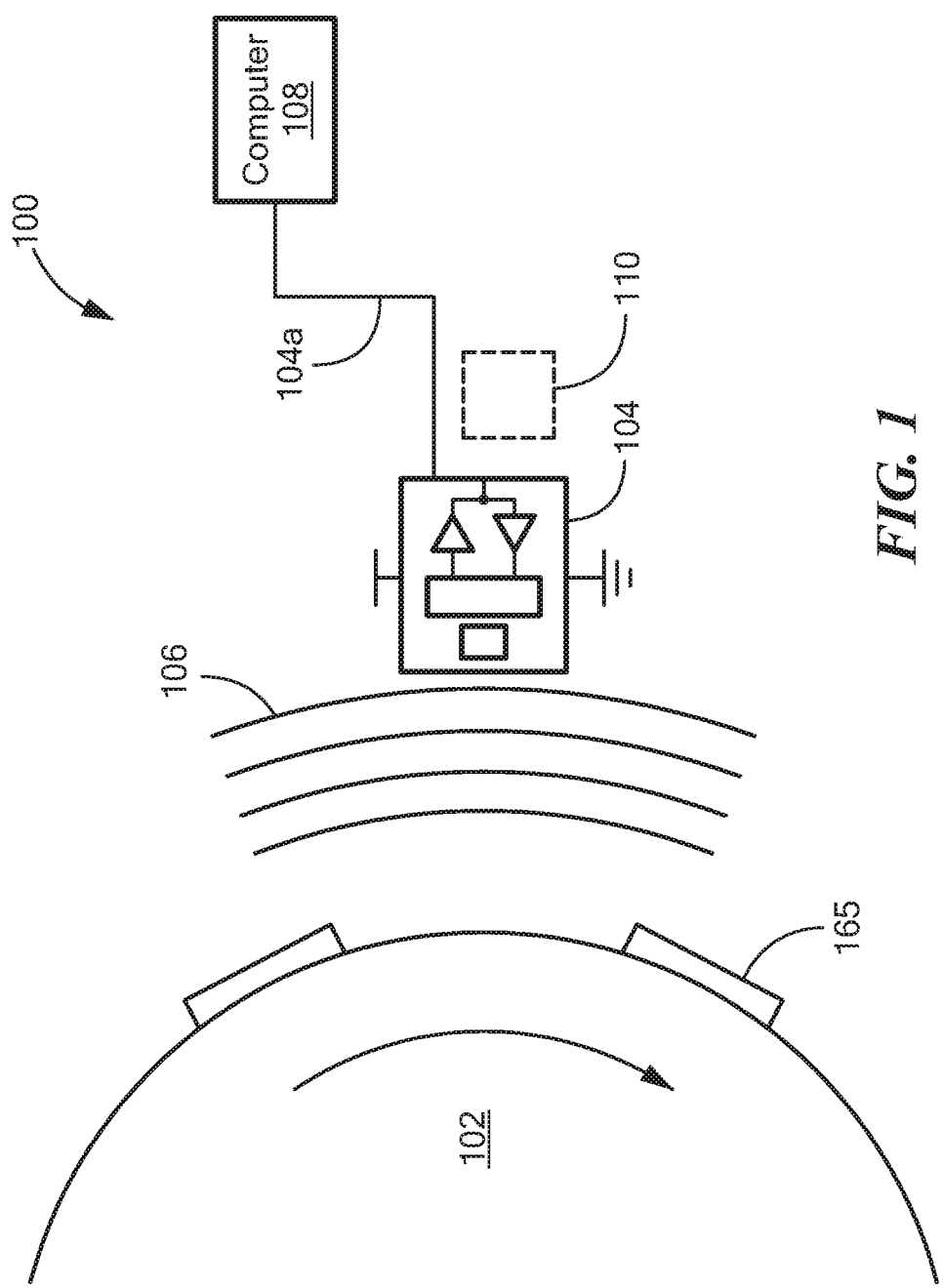
FIG. 1 is a block diagram of a system including a magnetic field sensor according to an embodiment.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements may have an axis of maximum sensitivity parallel to a substrate that supports the magnetic field sensing element, and others of the above-described magnetic field sensing elements may have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

As used herein, the term "multiple axis magnetic field sensor" refers to a device that can measure magnetic fields in two or more different axes (or "dimensions"). The term "relative gain" is used herein to refer to the gain of a magnetic field sensing element relative to the gain of one or more other magnetic field sensing elements. The term "gain equalization" refers to a property of multiple axis magnetic field sensors whereby the relative gain between two or more magnetic field sensing elements is generally invariant over time.

As used herein, the term "target" is used to describe an object to be sensed or detected by a magnetic field sensor or magnetic field sensing element. A target may be ferromagnetic, non-ferromagnetic, or magnetic.

FIG. 1 shows a system 100 for detecting a target 102, according to an embodiment of the disclosure. The system 100 may include a magnetic field sensor 104 placed adjacent to target 102 so that a magnetic field 106 can be sensed by magnetic field sensor 104. In an embodiment, target 102 is a magnetic target and produces external magnetic field 106. In another embodiment, magnetic field 106 is generated by a magnetic source 110 (e.g. a back-bias magnet or electromagnet). A target 102 may be either a magnetic or a non-magnetic target. In these instances, as target 102 moves through or within magnetic field 106, it causes perturbations to external magnetic field 106 that can be detected by magnetic field sensor 104.

Magnetic field sensor 104 may detect and process changes in external magnetic field 106. For example, magnetic field sensor 104 may detect changes in magnetic field 106 as target 102 rotates and features 165 move closer to and away from magnetic field sensor 104, thus increasing and decreasing the strength of the magnetic field 106 sensed by magnetic field sensor 104. Magnetic field sensor 104 may include circuitry to determine the speed, direction, proximity, angle, etc. of target 102 based on these changes to magnetic field 106. Although target 102 is shown as a toothed gear in FIG. 1, other arrangements and shapes that can affect magnetic field 106 as target 102 rotates are possible. For example, magnetic target 102 may have a non-symmetrical shape (such as an oval), may include sections of different material that affect the magnetic field, etc.

In an embodiment, magnetic sensor 104 is coupled to a computer 108, which may be a general purpose processor executing software or firmware, a custom processor, or a custom electronic circuit for processing output signal 104a from magnetic sensor 104. Output signal 104a may provide information about the speed, position, and/or direction of motion of target 102 to computer 108, which may then perform operations based on the received information. In an embodiment, computer 108 is an automotive computer (also referred to as an engine control unit) installed in a vehicle and target 102 is a moving part within the vehicle, such as a transmission shaft, a brake rotor, etc. Magnetic sensor 104 detects the speed and direction of target 102 and computer 108 controls automotive functions (like all-wheel drive, ABS, speedometer display control, etc.) in response to the information provided by magnetic field sensor 104.

In an embodiment, computer 108 may be located relatively distant from magnetic field sensor 104. For example, computer 108 may be located under the hood of a vehicle while magnetic field sensor 104 is located at a wheel or transmission element near the bottom and/or rear of the vehicle. In such an embodiment, having a serial communication interface with a minimal number of electrical connections (e.g. wires) between computer 108 and magnetic field sensor 104 may be beneficial, and may reduce cost and maintenance requirements.

In embodiments, where magnetic field sensor 104 operates as part of a system that affects vehicular safety such as the brake or transmission system, it may be desirable for magnetic field sensor 104 to perform self-tests and report to computer 108 any errors or faults that occur.

In embodiments, magnetic field sensor 104 includes multiple magnetic field sensing elements (e.g., the sensor 104 may be a 2D or a 3D magnetic field sensor). The sensor 104 may further include a coil structure and a gain equalization circuit that, together, can be used to equalize the gain of the magnetic field sensing elements in the presence of temperature, mechanical stress, and other phenomena that may affect sensitivity.

Figure 2:
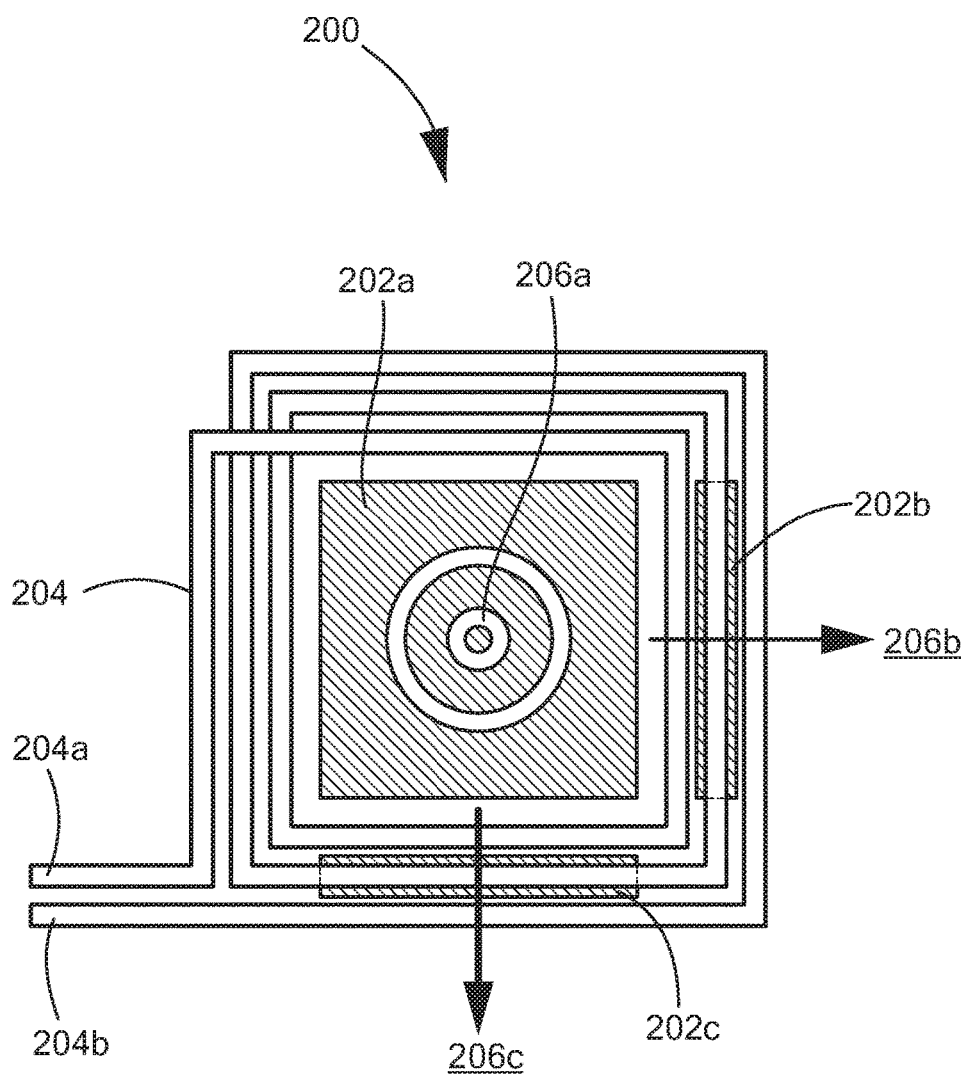
FIG. 2 is diagram of a structure having three magnetic field sensing elements and a coil structure, according to an embodiment.

Referring to FIG. 2, a structure 200 may be used for three-dimensional (3D) magnetic field sensing, according to one embodiment. The structure 200 may include three magnetic field sensing elements (or "sensing elements") 202a, 202b, 202c and a coil structure 204. In some embodiments, the structure 200 may be provided as an integrated circuit (IC).

In some embodiments, the sensing elements 202a-202c may be arranged to have a maximum response along three different axes (e.g., X, Y, and Z axes) to allow for 3D sensing. For example, a first sensing element 202a may be arranged to have a maximum response perpendicular to the page, a second sensing element 202b may be arranged to have a maximum response across the page, and a third sensing element 202c may be arranged to have a maximum response from top to bottom of the page. In this arrangement, the first sensing element 202a may be provided as a planar Hall effect element (or "Hall element"), whereas the second and third sensing elements 202b, 202c may be provided as vertical Hall elements.

The coil structure 204 may be provided from any material and in any orientation suitable to generate magnetic fields on the sensing elements 202a-202c. In some embodiments, the coil structure 204 is provided as a continuous length of conductive material (e.g., a metal) having two terminals 204a, 204b. The terminals 204a, 204b can be connected to a current source (not shown) to generate a current through the coil.

In some embodiments, the geometry of the coil structure 204 (e.g., the number and direction of windings) may be selected to generate a magnetic field having components substantially parallel to the axis of maximum response for each of the sensing elements 202a-202c.

For simplicity of explanation, various coil structures (such as coil structure 204) may be described herein as generating (or being configured to generate) multiple magnetic fields. It will be understood that such coil structures may actually generate a single magnetic field having field components in multiple different directions (e.g., along multiple different axes).

Referring again to FIG. 2, the coil structure 204 may be configured to generate a first field 206a parallel to the axis of maximum response for sensing element 202a, a second field 206b parallel to the axis of maximum response for sensing element 202b, and a third field 206c parallel to the axis of maximum response for sensing element 202c.

As explained above, in some embodiments the coil structure 204 comprises a continuous length of conductive material. This arrangement can be useful because the same windings create field on multiple sensing elements 202a-202c. In other embodiments, multiple coils may be used (e.g., one coil per sensing elements 202a-202c). The multiple coils could be coupled in series so that the same current is used to generate fields on each sensing elements 202a-202c. Alternatively, in some embodiments, the multiple coils could be coupled to multiple different current sources. Here, the current sources may use a mirroring technique (or similar methods for matching currents) in order to put nearly the same amount of current through each coil.

The magnetic field sensing elements 202a, 202b, and 202c may have sensitivities $S_1$, $S_2$, and $S_3$, respectively. The sensitivities $S_1$, $S_2$, and $S_3$ may vary with temperature, stress, and other conditions imposed, for example, on an IC substrate. When a current is passed through the coil structure 204, a magnetic field may be generated on each of the sensing elements 202a-202c. The magnitude of the field generated in the ith sensing element, which may be determined by the geometry of the coil structure 204, can be expressed in terms of a coupling factor $C_i$. The coupling factor $C_i$ for the ith sensing element 202 can be defined as the ratio of magnetic field sensed by that sensing element to the amount of current flowing through the coil structure 204. For a given structure 200, the ratios $C_1:C_2$, $C_1:C_3$, and $C_2:C_3$ may be generally invariant (e.g., not subject to changing temperature or stress conditions). In some embodiments, these relationships can be used to provide gain equalization, as described below in conjunction with FIG. 4.

As mentioned above, in some embodiments, the structure 200 may be provided as an integrated circuit. Here, the ratio of the coupling factors (i.e., $C_1:C_2$, $C_1:C_3$, and $C_2:C_3$) may be generally invariant from one die to the next. Thus, in certain embodiments, these ratios can be characterized prior to operation (e.g., during design or testing) and configured within the structure 200. In some embodiments, these preconfigured values can be used to provide gain equalization, as described below in conjunction with FIG. 4.

Embodiments of the structures described above in conjunction with FIG. 2 can be used in conjunction with systems and circuits described below in conjunction with FIGS. 4 and 5.

Figure 3:
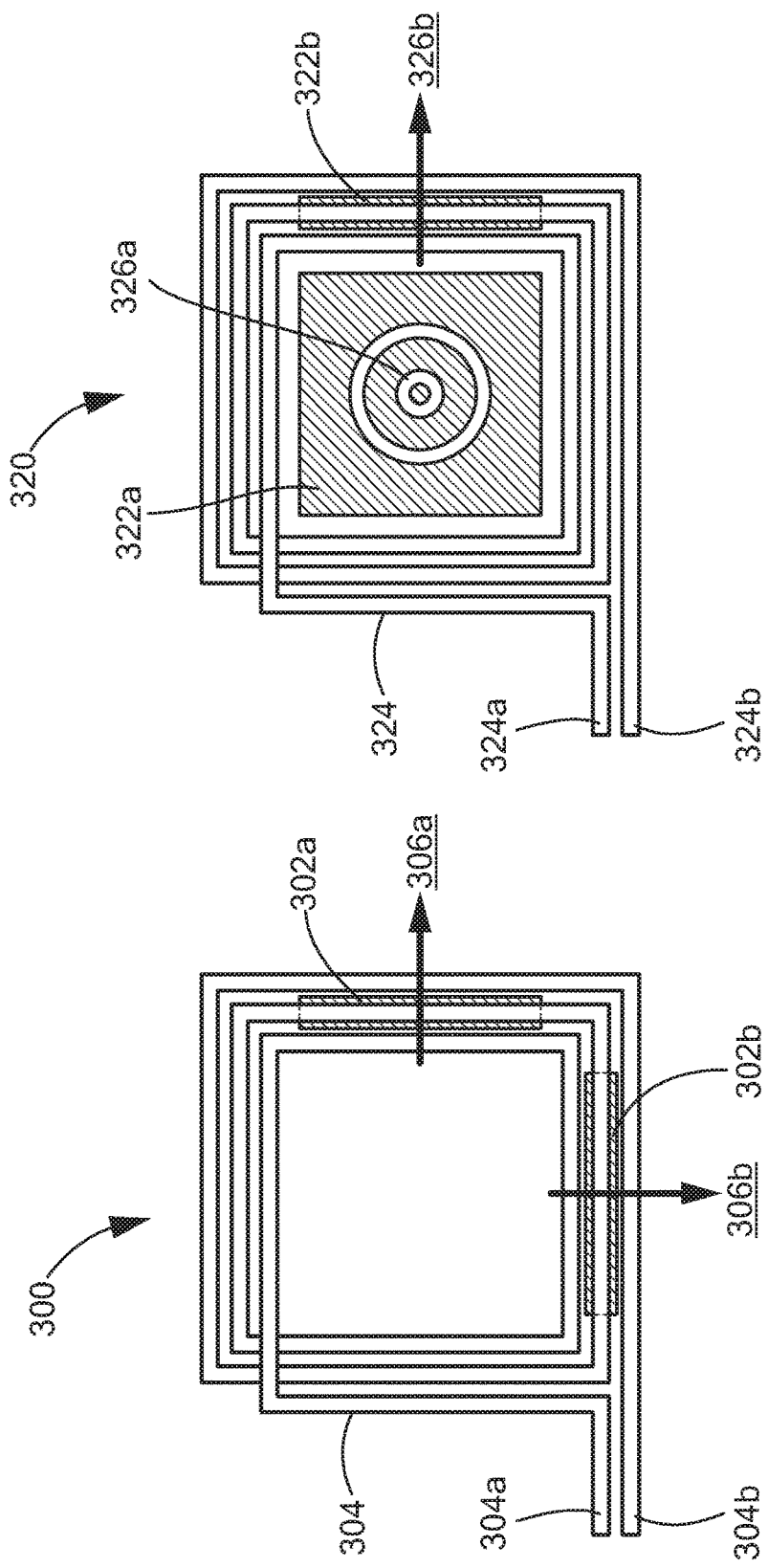
FIG. 3 is a diagram of a structure having two magnetic field sensing elements and a coil structure, according to an embodiment.

Referring to FIG. 3, a structure 300 may be used for 2D magnetic field sensing, according to one embodiment. The structure 300 may include two magnetic field sensing elements 302a, 302b and a coil structure 304. In some embodiments, the structure 300 may be provided as an integrated circuit.

The magnetic field sensing elements 302a, 302b may be arranged to have maximum responses along two different axes to allow for 2D sensing. For example, as shown in FIG. 3, a first sensing element 302a may be arranged to have a maximum response across the page and a second sensing element 302b may be arranged to have a maximum response from top to bottom of the page. In this arrangement, both sensing elements 302a, 302b may be provided as vertical Hall elements.

The coil structure 304 may be provided from any material and in any orientation suitable to generate magnetic fields on both sensing elements 302a, 302b. In some embodiments, the coil structure 304 may be provided as a continuous length of conductive material having two terminals 304a, 304b that can be connected to a current source (not shown) to generate a current through the coil. In other embodiments, the coil structure 304 may be provided as multiple coils coupled in series or multiple coils coupled to different current sources.

In some embodiments, the geometry of the coil structure 304 may be selected to generate a magnetic field substantially parallel to the axis of maximum response for each of the sensing elements 302a, 302b. For example, as shown in FIG. 3, the coil structure 304 may be configured to generate a first field 306a parallel to the axis of maximum response for sensing element 302a, and a second field 306b parallel to the axis of maximum response for sensing element 302b.

The magnetic field sensing elements 302a, 302b may have sensitivities $S_1$ and $S_2$, respectively. The sensitivities $S_1$ and $S_2$ may vary with temperature, stress, and other conditions imposed, for example, on an IC substrate. When a current is passed through the coil structure 304, the magnetic field generated in the ith sensing element may be determined by the geometry of the coil structure 304 and can be expressed in terms of a coupling factor $C_i$. For a given structure 300, the ratio $C_1:C_2$ may be generally invariant (e.g., not subject to changing temperature or stress conditions). In some embodiments, these relationships can be used to provide gain equalization, as described below in conjunction with FIG. 4.

As mentioned above, in some embodiments, the structure 300 may be provided as an integrated circuit. Here, the ratio of the coupling factors (i.e., $C_1:C_2$) may be generally invariant from one die to the next. Thus, in certain embodiments, these ratios can be characterized prior to operation (e.g., during design or testing) and configured within the structure 300. In some embodiments, these pre-configured values can be used to provide gain equalization, as described below in conjunction with FIG. 4.

Embodiments of the structures described above in conjunction with FIG. 3 can be used in conjunction with systems and circuits described below in conjunction with FIGS. 4 and 5.

Referring to FIG. 3A, a structure 320 may be used for 2D magnetic field sensing, according to another embodiment. The structure 320 may include two magnetic field sensing elements 322a, 322b and a coil structure 324. A first sensing element 324a may be arranged to have a maximum response perpendicular to the page and a second sensing element 322b may be arranged to have a maximum response across the page. In this arrangement, first sensing element 322a may be provided as a planar Hall element and second sensing element 322b may be provided as vertical Hall element. In some embodiments, the structure 320 may be provided as an integrated circuit.

The coil structure 324 may be provided from any material and in any orientation suitable to generate magnetic fields on both sensing elements 322a, 322b. In some embodiments, the coil structure 324 may be provided as a continuous length of conductive material having two terminals 324a, 324b that can be connected to a current source (not shown) to generate a current through the coil. In other embodiments, the coil structure 324 may be provided as multiple coils coupled in series or multiple coils coupled to different current sources.

In some embodiments, the geometry of the coil structure 324 may be selected to generate a magnetic field substantially parallel to the axis of maximum response for each of the sensing elements 322a, 322b. For example, as shown in FIG. 3A, the coil structure 324 may be configured to generate a first field 326a parallel to the axis of maximum response for sensing element 322a, and a second field 326b parallel to the axis of maximum response for sensing element 322b.

The magnetic field sensing elements 322a and 322b may have sensitivities $S_1$ and $S_2$, respectively. The sensitivities $S_1$, $S_2$ may vary with temperature, stress, and other conditions imposed, for example, on an IC substrate. When a current is passed through the coil structure 324, the magnetic field generated in the ith sensing element may be determined by the geometry of the coil structure 324 and can be expressed in terms of a coupling factor $C_i$. For a given structure 320, the ratio $C_1:C_2$ may be generally invariant (e.g., not subject to changing temperature or stress conditions). In some embodiments, these relationships can be used to provide gain equalization, as described below in conjunction with FIG. 4.

As mentioned above, in some embodiments, the structure 320 may be provided as an integrated circuit. Here, the ratio of the coupling factors (i.e., $C_1:C_2$) may be generally invariant from one die to the next. Thus, in certain embodiments, these ratios can be characterized prior to operation (e.g., during design or testing) and configured within the structure 320. In some embodiments, these pre-configured values can be used to provide gain equalization, as described below in conjunction with FIG. 4.

Embodiments of the structures described above in conjunction with FIG. 3A can be used in conjunction with systems and circuits described below in conjunction with FIGS. 4 and 5.

Figure 4:
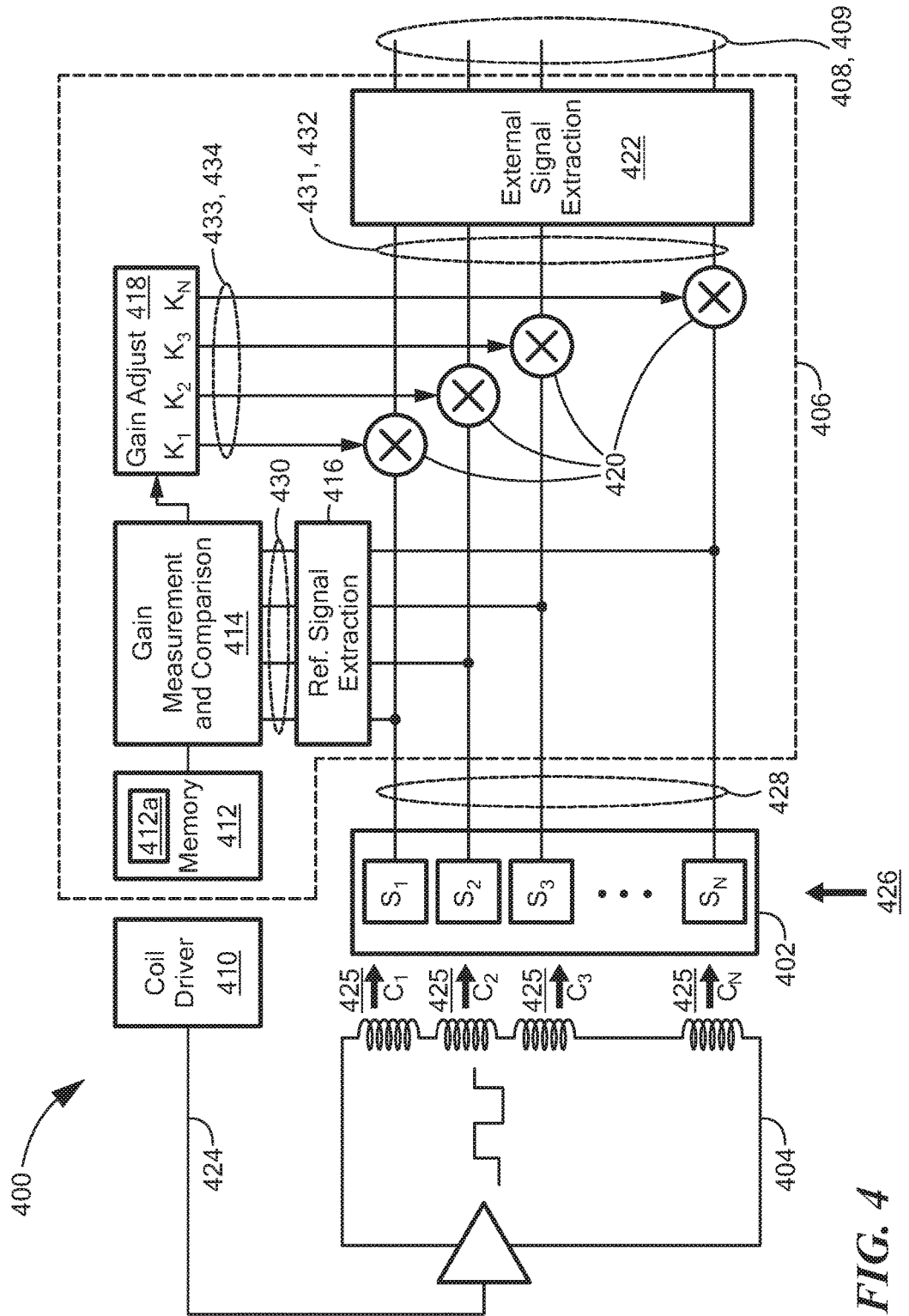
FIG. 4 is a block diagram of a magnetic field sensor that can provide gain equalization, according to an embodiment.

FIG. 4 shows a magnetic field sensor 400 that can provide gain equalization, according to an embodiment. The sensor 400 may comprise a plurality (N) of magnetic field sensing elements 402, a coil structure 404, a coil driver 410 coupled to the coil structure 404, a gain equalization circuit 406, and a plurality (N) of outputs 408. Each of the plurality of sensing elements 402 may have a respective sensitivity $S_1$, $S_2$, ..., $S_N$ and a respective coil coupling factor $C_1$, $C_2$, ..., $C_N$, as shown. The ratios of the coupling factors (e.g., $C_1:C_2$, $C_2:C_3$, etc.) may be generally invariant (e.g., not subject to changing temperature or stress conditions).

In some embodiments, the magnetic field sensors 402 and coil structure 404 may be provided as a structure that is the same as or similar to structures 200, 300, or 320 of FIG. 2, 3, or 3A, respectively.

The gain equalization circuit 406 may include a memory 412; a gain measurement and comparison processor (or "measurement-comparison processor") 414 having access to the memory 412; a reference signal extraction processor 416 having a plurality of inputs, each coupled to an output of a respective one of the sensing elements 402, and a plurality of outputs, each coupled to a respective one of a plurality of measurement-comparison processor 414 inputs; a gain adjustment processor 418 having an input coupled to an output of the measurement-comparison processor 414 and a plurality of outputs 433; a plurality of multipliers 420, each having a first input coupled to an output of a respective one of the sensing elements 402, a second input coupled to a respective one of the gain adjustment processor 418 outputs 433, and an output; and an external signal extraction processor 422 having a plurality of inputs 431, each coupled to an output of a respective one of the multipliers 420, and a plurality of outputs that may correspond to sensor outputs 408.

The coil driver 410 may be configured to generate a coil drive signal 424, which may be applied to the coil structure 404 to generate a current there through. In response, the coil structure 404 may generate reference magnetic fields (or "reference fields") 425 on each of the sensing elements 402, whereby the magnitude of the reference field 425 on the ith sensing element 402 is determined by the respective coupling factor $C_i$.

Each sensing element 402 may generate a corresponding output signal 428 that can be responsive to both the reference field 425 and to other magnetic fields ("external fields") 426 about the sensor 400. For example, external fields 426 may include fields generated by a target, such as target 102 in FIG. 1. The portion of a sensing element output signal 428 responsive to the reference field 425 is referred to herein as the "reference signal" and the portion responsive to external fields 426 is referred to herein as the "external signal."

In some embodiments, the coil driver 410 may be configured to generate a coil drive signal 424 having a particular waveform that enables gain equalization circuit 406 to extract the reference signal and the external signal portions from a sensing element's output signal 428. In some embodiments, sensor 400 may use a frequency multiplexing technique, whereby the frequency of the coil drive signal 424 is selected to be substantially higher than that of external fields 426 being measured by the sensor. In this arrangement, the reference signal extraction processor 416 and external signal extraction processor 422 may be configured to filter reference and external signals, respectively, from a sensing element output signal 428, as described further below in conjunction with FIG. 5.

In other embodiments, the coil structure 404 may be configured to generate a differential field in each axis of measurement, meaning that, in each axis, the coil structure 614 can generate fields in both positive and negative directions (e.g., +X and −X). Further, each of the sensing elements 426 may represent a pair of magnetic field sensing sub-elements (e.g., two Hall plates) physically separated from each other but measuring fields in the same axis. In this arrangement, a sensing element output signal 428 may correspond to the sum or difference of the sub-elements, which can be selected to cancel out either the reference signal or the external signal, as described further below in conjunction with FIG. 8.

The measurement-comparison processor 414 may be configured to receive the reference signals 430 and to generate corresponding gain adjustment values $K_1, K_2, \ldots, K_N$ that can be used to equalize the gains of the sensing element output signals 428. In some embodiments, the measurement-comparison processor 414 may use a two step procedure to calculate gain adjustment values $K_1, K_2, \ldots, K_N$.

In a first step, the measurement-comparison processor 414 may measure a gain for each of reference signals 430. The magnitude (e.g., voltage or amplitude) of the ith reference signal 430 (herein denoted $M_i$) may be proportional to the gain $C_i \times S_i$, where $C_i$ is generally invariant and the sensitivity $S_i$ represents an instantaneous magnetic field sensitivity that can vary due to temperature, stress, and other phenomena.

In some embodiments, the measurement-comparison processor 414 may measure an absolute gain for each of the reference signals 430. Here, the current going into the coil structure 404 may be accurately controlled over temperature, stress, etc. and, thus, the reference field 425 may be known. The absolute gain of the ith reference signal 430 (herein denoted $G_i$) may be calculated using the known reference field 425 and the measured magnitude $M_i$.

In other embodiments, the measurement-comparison processor 414 may measure a relative gain for each of the reference signals 430. The relative gains can be determined even if the reference field 425 may be unknown because (a) the same current may be used to generate each of the reference fields 425 (e.g., via a continuous coil structure 404) and (b) the ratio of the coupling factors (e.g. $C_1:C_2$) is generally invariant. Thus, the relative gain of the ith reference signal 430 (herein denoted $G_i$) may be calculated using the known reference field 425 and the measured magnitude $M_i$.

In a second step, the measurement-comparison processor 414 may compare the measured gains $G_1, G_2, \ldots G_N$ (which, as indicated above, may be absolute gains or relative gains) to reference gains in order to calculate the gain adjustment values $K_1, K_2, \ldots, K_N$. The reference gains may be stored within memory 412. In some embodiments, the reference gains may include N absolute gains (herein denoted $R_1, R_2, \ldots R_N$), one for each of the N sensing elements 402. The absolute reference gains $R_1, R_2, \ldots R_N$ can be directly compared to respective ones of the measured gains $G_1, G_2, \ldots G_N$. For example, the ith gain adjustment value may be calculated as $K_i = R_i/G_i$. In other embodiments, the reference gains may include relative gains between two or more of the sensing elements 402. The relative reference gains may be expressed as ratios, where the relative reference gain between the ith and jth sensing elements is herein denoted $R_{i:j}$. Here, the measurement-comparison processor 414 may select adjustment values $K_1, K_2, \ldots, K_N$ such that the ratio of measured gains multiplied by the respective gain adjustment values equals the reference ratios, e.g., $G_1*K_1:G_2*K_2=R_{1:2}$.

It is appreciated herein that controlling the ratio of sensing element gains can be used to indirectly control for absolute gain in some situations. For example, in certain embodiments, at least one of the sensing elements 202 may be highly accurate whereas other ones of the sensing elements may be less accurate. In this case, the gain adjustment value K for the highly accurate sensing element may be fixed to a constant value (e.g., one) and the other gain adjustment values may be selected dynamically as described above. Thus, even if the current in the current 424 in the coil drifts (e.g., due to temperature), all sensor outputs 408 may be highly accurate.

In some embodiments, memory 412 may include writable memory and the reference gains may be determined during operation of the sensor 400 and written thereto. In some embodiments, the reference gains are determined when operation commences using the measured gains $G_1, G_2, \ldots G_N$. For example, at time zero, the measurement-comparison processor 414 may set N reference gains equal to the measured gains (e.g., $R_1=G_1, R_2=G_2$, etc.) and store the new reference gains in memory 412.

In certain embodiments, memory 412 may include non-volatile memory and the reference gains may be determined prior to operation and stored therein. In some embodiments, the non-volatile memory may be provided as EEPROM (Electrically Erasable Programmable Read-Only Memory) or another type of read-only memory. Prior to operation (e.g., during design or testing) a known magnetic field may be applied to one or more of the sensing elements 402 in order to determine the relative/absolute reference gains. The reference gains can be stored in non-volatile memory for use during subsequent operation.

In some embodiments, memory 412 may be configured to store user-adjustable trim values 412a. In various embodiments, the trim values 412a may be stored within non-volatile memory. The trim values 412a may be used to control various aspects of gain equalization. For example, in some embodiments, the reference gains (either relative or absolute) may be stored as trim values 412a so that they can be accessed and adjusted by a user. As another example, the reference gains in memory 412 (e.g., reference gains determined by measuring) may be scaled by trim values 412a to allow a user to adjust gain in one or more axes of measurement.

As discussed above, in some embodiments, the sensor 400 (or portions thereof) may be provided as an integrated circuit and, as a result, the ratio of the sensing element coupling factors (e.g., $C_1:C_2, C_2:C_3$, etc.) may be generally invariant from one die to the next. In such embodiments, relative reference gains $R_{1:2}, R_{2:3}$, etc. can be derived using a priori knowledge of coupling factors and a single gain measurement. In certain embodiments, the coupling factor ratios $C_1:C_2, C_2:C_3$, etc. may be characterized prior to operation (e.g., during design or testing) and stored within the sensor 400 (e.g., the coupling factors could be "hardwired" or stored in non-volatile memory). The sensor 400 may then be trimmed in multiple axes by measuring the gain from a single sensing element 426. In certain embodiments, the coil drive current 424 may be trimmed.

In some embodiments, the trim values 412a may include a coil current trim value which may be used by the coil driver 410 to determine the current through the coil structure 404. The coil current trim value can be adjusted by a user to maintain highly accurate current through the coil structure 404. As discussed above, if the current through the coil structure 404 can be accurately controlled over temperature, stress, etc., then the sensor 400 can keep the absolute gain of each sensing element 402 relatively constant.

The gain adjustment processor 418 may be configured to receive the gain adjustment values $K_1, K_2, \ldots, K_N$ values from the measurement-comparison processor 414 and to generate respective gain adjustment signals 434.

Each of the multipliers 420 may be configured to receive a respective one of the sensing element output signals 428 and a respective one of the gain adjustment signals 434, and to scale the sensing element output signal 428 according to the gain adjustment signal 434 to generate a gain-adjusted signal 432. It will be appreciated that the relative gain (and, in some embodiments, the absolute gain) of the gain-adjusted signals 432 will be equalized based on the reference gains in memory 412.

In some embodiments, multipliers 420 may be provided as analog circuitry and the gain adjust signals 434 may be analog signals. In other embodiments, multipliers 420 may be provided as one or more digital components and the gain adjust signals 434 may be digital signals.

In some embodiments, such as the embodiment shown in FIG. 4, the gain-adjusted signals 432 may be responsive to both reference fields 425 and external fields 426. Thus, the external signal extraction processor 422 may be configured to extract gain-adjusted external signals 409 from the gain-adjusted signals 432, where the gain-adjusted external signals 409 are generally responsive to the external fields 426 but not the reference fields 425. In some embodiments, and as shown in FIG. 4, the gain-adjusted external signals 409 may be provided at the sensor outputs 408. In other embodiments, additional signal processing may be performed on the gain-adjusted external signals 409. In one embodiment, the external signal extraction processor 422 may utilize structures and techniques described below in conjunction with FIG. 5.

The embodiment shown in FIG. 4 may be characterized as having a feed forward design because inputs of the measurement-compensation processor 414 are directly coupled to outputs of the sensing elements 402. In other embodiments, a feedback design may be employed, wherein inputs of the measurement-compensation processor 414 may receive gain-adjusted signals, resulting in a feedback loop between the gain adjustment portions of the circuit and the gain measurement portions of the circuit. For example, in one embodiment, outputs of the multipliers 420 could be directly coupled to inputs of the measurement-compensation processor 414.

The operation of the sensor 400, according to some embodiments, is described next. Initially, each of the gain adjustment values $K_1, K_2, \ldots, K_N$ may be set to a value of one such that the gain adjustment signals 434 will have no effect on the sensing element output signals 428 (i.e., initially, the sensor output signals 408 may not be equalized).

The coil driver 410 may generate a coil drive signal 424 that, in turn, results in a current through the coil structure 404 and reference fields 425 generated on the magnetic field sensing elements 402. The magnitude of the field on the ith sensing element 402 may be determined by the respective coupling factor $C_i$. The sensing elements 402 may generate output signals 428 responsive to the reference fields 425 and external fields 426. The reference signal extraction processor 416 may receive the sensing element output signals 428 and extract reference signals 430 therefrom. The measurement-comparison processor 414 may measure gains $G_1, G_2, \ldots, G_N$ for each of the N reference signals 430 and compare the measured gains against reference gains (if any) stored within memory 412 to generate new gain adjustment values $K_1, K_2, \ldots, K_N$.

In some embodiments, reference gains may not be stored in memory 412 prior to sensor start-up. Here, the relative/absolute reference gains may be calculated based on initial gain measurements $G_1, G_2, \ldots, G_N$ and stored in memory 412. In other embodiments, reference gains may be stored in non-volatile memory prior to sensor start-up. In certain embodiments, trim values 412a may also be used to determine and/or scale reference gains.

The gain adjustment processor 418 may generate gain adjustment signals 434 based on the gain adjustment values $K_1, K_2, \ldots, K_N$. Each of the multipliers 420 may receive a respective sensing element output signal 428 and a respective gain adjustment signal 434, and generate a gain-adjusted signal 432. The external signal extraction processor 422 may extract the portion of the gain-adjusted signals 432 responsive to the external field to generate gain-adjusted external signals 409. The relative gains (and, in some embodiments, the absolute gains) of the gain-adjusted external signals 409 will be equalized based on the reference gains in memory 412. This process can be repeated over time, adjusting the gain of the sensing element output signals 428 in order to maintain gain equalization.

Figure 5:
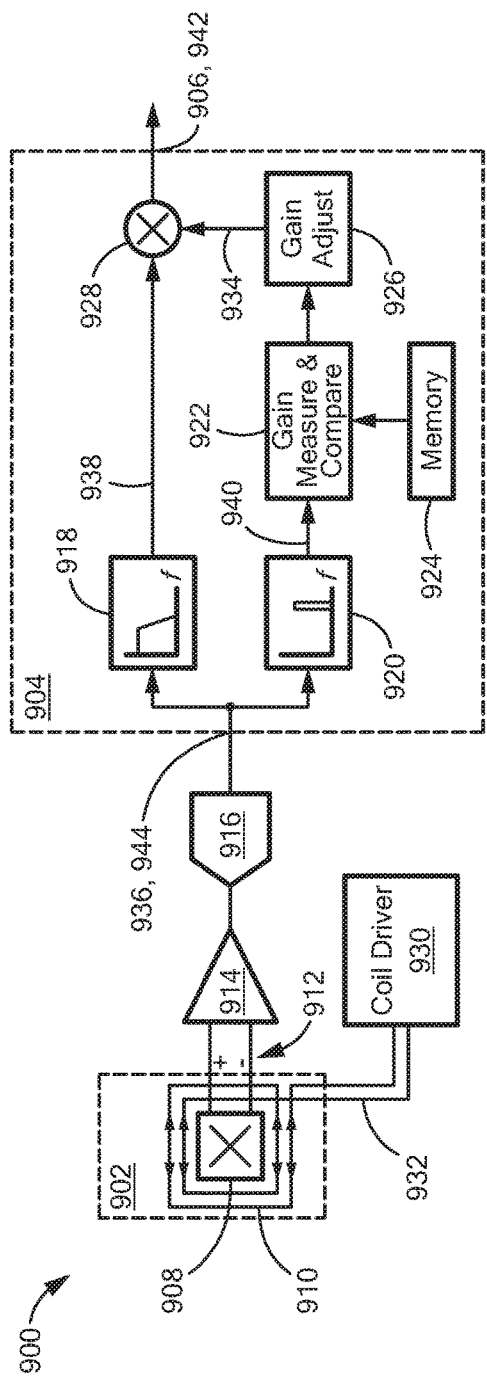
FIG. 5 is a block diagram of a magnetic field sensor that can provide gain equalization using frequency multiplexing, according to an embodiment.

FIG. 5 shows a magnetic field sensor 900 that can provide gain equalization using frequency multiplexing (sometimes referred to as "frequency-division multiplexing" or "FDM"), according to an embodiment of the disclosure. The sensor 900 may include a structure 902 for (N-dimensional) magnetic field sensing, a gain equalization circuit 904, and a plurality (N) of outputs 906. The magnetic field sensor 900 may further include a coil driver 930 coupled to the coil structure 910.

The structure 902 may include a plurality (N) of magnetic field sensing elements 908 and a coil structure 910 configured to generate reference fields thereon. In some embodiments, N=3 and the structure 902 may be the same as or similar to embodiments of the structure 200 shown in FIG. 2 and described above in conjunction therewith. In other embodiments, N=2 and the structure 902 may be the same as or similar to embodiments of the structures 300, 320 shown in FIGS. 3, 3A and described above in conjunction therewith.

The gain equalization circuit 904 may include a plurality (N) of inputs 936 each coupled to an output 912 of a respective one of the sensing elements 908. A given sensing element 908 may be coupled to the gain equalization circuit 904 via a signal path comprising one or more circuit elements. In the illustrated embodiment, each such signal paths may include a front-end (FE) amplifier 914.

In some embodiments, the gain equalization circuit 904 may process digital signals (e.g., 16-bit digital signals) and, thus, the sensor 900 may include a plurality (N) of analog-to-digital converters (ADC) 916 to convert analog sensing element output signals to digital signals.

The gain equalization circuit 904 may further include a plurality (N) of external signal filters 918 each having an input coupled to an output of a respective circuit input 936; a plurality (N) of reference signal filters 920 each having an input also coupled to a respective circuit input 936; a gain measurement and comparison processor (or "measurement-comparison processor") 922 having a plurality of inputs coupled to respective ones of the plurality of reference signal filter 920 outputs; a memory 924 accessible by the measurement-comparison processor 922; a gain adjustment processor 926 having an input coupled to an output of the measurement-comparison processor 922; and a plurality (N) of multipliers 928 each having an first input coupled to an output of a respective external signal filter 918, a second input coupled to an output of the gain adjustment processor 926, and an output coupled to a respective circuit output 906.

For clarity in the drawing, only one magnetic field sensing element 908, one amplifier 914, one ADC 916, one external signal filter 918, one reference signal filter 920, and one multiplier 928 are shown. Thus, the illustrated magnetic field sensing element 908 may represent a sensing element along one axis, and the other components 914, 916, 918, 920, 928 may be coupled to process output from that single sensing element 908. It should be understood that, in general, the sensor 900 may include a plurality (N) of sensing elements 908 (one for each axis of measurement) and a respective plurality of each of the components 914, 916, 918, 920, 928.

In some embodiments, measurement-comparison processor 922 may be the same as or similar to embodiments of the measurement-comparison processor 414 described above in conjunction with FIG. 4. In certain embodiments, gain adjustment processor 926 may be the same as or similar to embodiments of the gain adjustment processor 418 described above in conjunction with FIG. 4. In some embodiments, memory 924 may be configured the same as or similar to memory 412 as described above in conjunction with FIG. 4. In particular embodiments, coil driver 930 may be configured the same as or similar to coil driver 410 as described above in conjunction with FIG. 4.

The coil driver 930 may be configured to generate a coil drive signal 932 through the coil structure 910 to generate reference fields on each of the sensing elements 908. In response, each of the sensing elements 908 may generate an output signal 912 that is responsive to the respective reference field and to external fields. In other words, a sensing element output signal 912 may include a reference signal portion and an external signal portion.

Figure 5A:
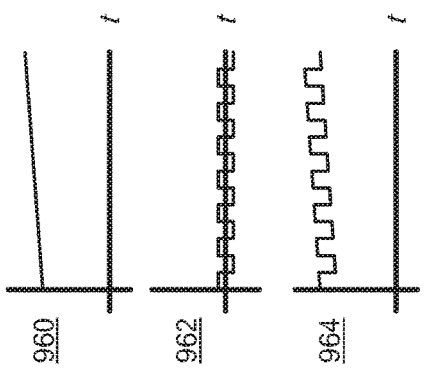
FIG. 5A are waveform diagrams of illustrative signals that may be generated and/or processed by the magnetic field sensor of FIG. 5.

Referring to FIG. 5A, in various embodiments, the sensor 900 may use frequency multiplexing to distinguish between reference signals and external signals. The coil driver 930 may be configured to generate coil drive signal 962 having a frequency that is significantly higher than that of external fields 960. In some embodiments, the coil drive signal 962 may be generated as an alternating current (AC) signal having a relatively high frequency. The resulting sensing element output signal 964 may be responsive to both the low-frequency external field 960 and the high-frequency reference field 962, as shown.

Referring again to FIG. 5, each of the sensing element output signals 912 may be amplified and digitized to generate digital sensing element output signals 944 as input to the gain equalization circuit 904. Each of the digital sensing element output signals 944 may be passed as input to both a respective external signal filter 918 and a respective reference signal filter 920. The external signal filter 918 may be configured to isolate or extract an external signal 938 and the reference signal filter 920 may be configured to isolate or extract a reference signal 940.

In some embodiments, the external signal filter 918 may comprise a lowpass filter to reject high-frequency reference field response. In certain embodiments, the reference signal filter 920 may comprise a bandpass filter to reject low-frequency external field response. In other embodiments, the reference signal filter 920 may utilize a mixer to reject low-frequency external field response.

The measurement-comparison processor 922 may be configured to calculate gain adjustment values $K_1, K_2, \ldots, K_N$ using measurements of the reference signals 940, and using reference gains stored within memory 924. In some embodiments, the measurement-comparison processor 922 may utilize techniques described above in conjunction with measurement-comparison processor 414 of FIG. 4 to calculate gain adjustment values $K_1, K_2, \ldots, K_N$.

The gain adjustment processor 926 may be configured to generate a gain adjustment signal 934 based a respective one of the gain adjustment values $K_1, K_2, \ldots, K_N$. The multiplier 928 may be configured to scale the external signal 938 by the gain adjustment signal 934 to generate a gain-adjusted external signal 942.

It will be appreciated that the magnetic field sensor 900 shown in FIG. 5 differs from the magnetic field sensor 400 of FIG. 4 in certain respects. As one example, in FIG. 4, external signal extraction occurs after gain adjustment (i.e., output of multipliers 420 is coupled to input of the external signal extraction processor 422), whereas, in FIG. 5, external signal extraction occurs before gain adjustment (i.e., output of external signal filter 918 is coupled to input of multiplier 928). It should be understood that the concepts sought to be protected herein are not limited to the specific embodiments shown in the figures.

While embodiments of the sensor 900 shown in FIG. 5 and described herein may include an analog portion and a digital portion, it will be appreciated that the particular delineation of which circuit functions are implemented in an analog fashion or with digital circuitry and signals can be varied. Further, some of the described circuit functions can be implemented on an integrated circuit and other circuitry and functionality can be implemented on separate circuits (e.g., additional substrates within the same integrated circuit package, or additional integrated circuit packages, and/or on circuit boards).

Figure 6:
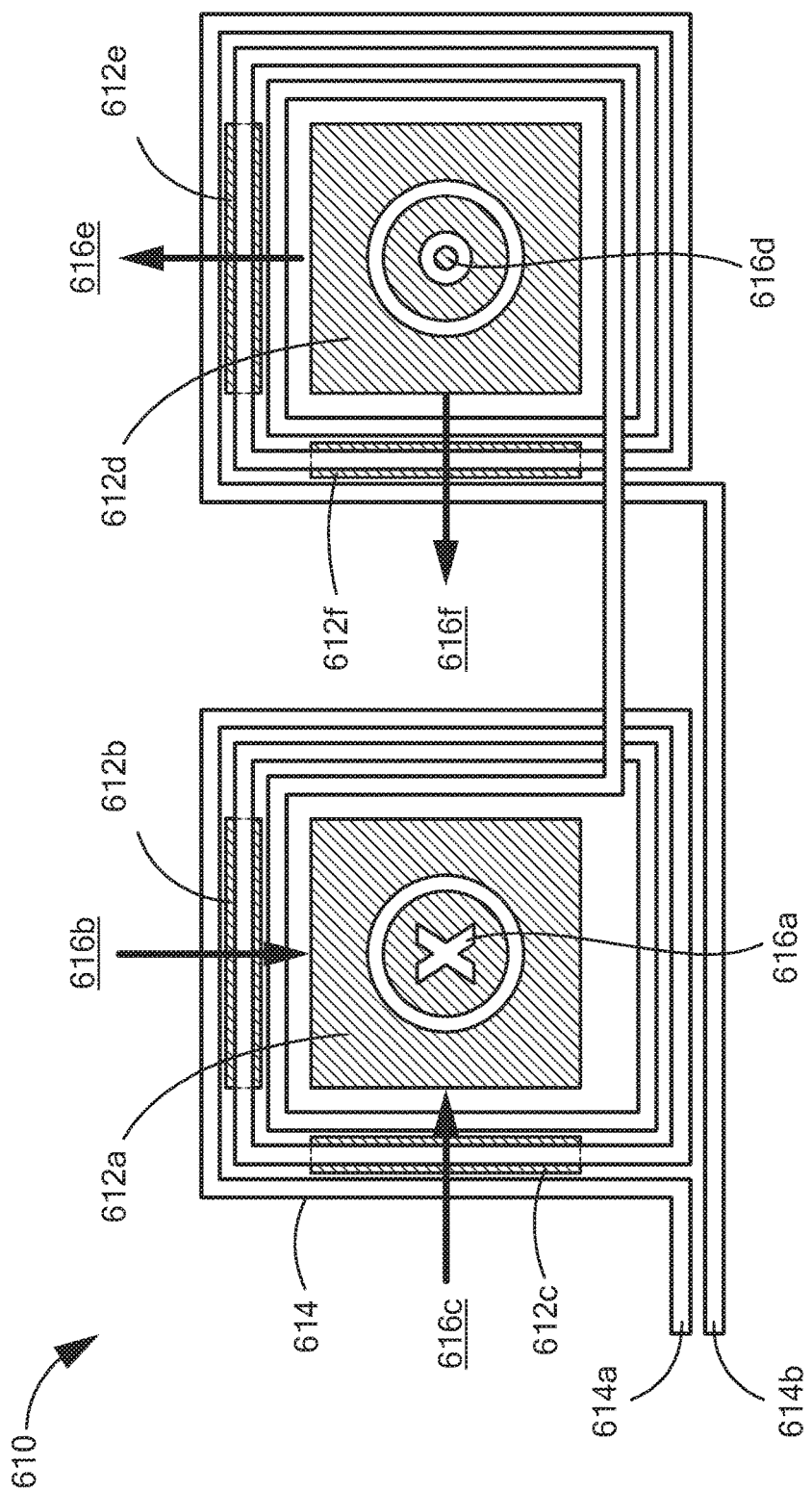
FIG. 6 is a block diagram of a structure having three differential magnetic field sensing elements and a coil structure, according to an embodiment.

Referring to FIG. 6, a structure 610 may be used for 3D magnetic field sensing, according to one embodiment. The structure 610 may include six magnetic field sensing elements (or "sensing elements") 612a, 612b, 612c, 612d, 612e, 616f and a coil structure 614.

The six sensing elements 612a-612f may be arranged to provide three so-called "differential magnetic field sensing elements," each comprising a pair of sensing elements oriented along a common axis of measurement. For example, as shown, sensing elements 612a and 612d may form a first differential magnetic field sensing element (or "differential sensing element") having a maximum response perpendicular to the page, sensing elements 612b and 612e may form a second differential magnetic field sensing element having a maximum response up and down the page, and sensing elements 612c, 612f may form a third differential magnetic field sensing element having a maximum response across the page. In this arrangement, sensing elements 612a and 612d may be provided as a planar Hall element, whereas the sensing elements 612b, 612c, 612e, and 612f may be provided as vertical Hall elements.

The coil structure 614 may be provided from any material and in any orientation suitable to generate magnetic fields on the sensing elements 612a-612f. In some embodiments, the coil structure 614 is provided as a continuous length of conductive material having two terminals 614a, 614b. The terminals 614a, 614b can be connected to a current source (not shown) to generate a current through the coil. In other embodiments, the coil structure 614 may be provided as multiple coils coupled in series or multiple coils coupled to different current sources.

The coil structure 614 may be configured to generate a "differential magnetic field" in each axis of measurement, meaning that, in each axis, the coil structure 614 can generate fields in both positive and negative directions (e.g., +X and −X). Each of the differential fields may be generated on a respective one of the differential sensing elements. For example, as shown in FIG. 6, the coil structure 614 may be configured to generate a first differential field 616a, 616d perpendicular to the page, with field 616a generated on sensing element 612a and opposing field 616d generated on sensing element 612d; a second differential field 616b, 616e up and down the page, with field 616b generated on sensing element 612b and opposing field 616e generated on sensing element 612e; and a third differential field 616c, 616f across the page, with field 616c generated on sensing element 612c and field 616f generated on sensing element 612f.

In some embodiments, differential fields can be generated using a coil structure 614 having two sets of windings wound in opposing directions. For example, as shown in FIG. 6, the coil structure 614 may be wound in a first direction around sensing element 612a and in the opposite direction around sensing element 612d. Likewise, the coil structure 614 may be wound in opposing directions around sensing elements 612b and 612e, and also in opposing directions around sensing elements 612c and 612f.

Positive current entering terminal 614b flows clockwise around sensing element 612d and counterclockwise around hall element 612a. The coil structure 614 may be positioned over the top of the sensing elements 612 and positive magnetic fields may be generated in the direction shown by arrows 616b, 616c, 616e, and 616f In additional, positive magnetic fields may be generated in the direction going into the page as shown by "X" 616a and in the direction coming out of the page as shown by circle 616d.

As explained below in conjunction with FIG. 8, using differential fields can allow external signals and reference signals to be distinguished by adding or subtracting the signals from two sensing elements having a common axis of measurement. In particular, outputs of each half of a differential sensing elements can be connected in such a way to either pass or reject the signal generated by the coil structure. When connected in parallel, opposing coil signals may average to zero and identical external signals may average to form a single external signal, thus the coil signal is rejected and the external signal is passed. When connected in antiparallel, opposing coil signals may average to form a single coil signal and identical external signals may average to zero.

Turning back to FIG. 6, the magnitude of the differential field generated in the ith sensing element 612 may be expressed in terms of a coupling factor $C_i$, which may be determined by the geometry of the coil structure 614. In some embodiments, the multiple sensing elements 612a-612f may be fabricated on a common die using mass production techniques that reduce variance between different sensing elements. For a given structure 610 design, the ratio of the coupling factors (e.g., $C_1:C_2$, $C_2:C_3$, etc.) may remain generally invariant from one die to the next.

Figure 8:
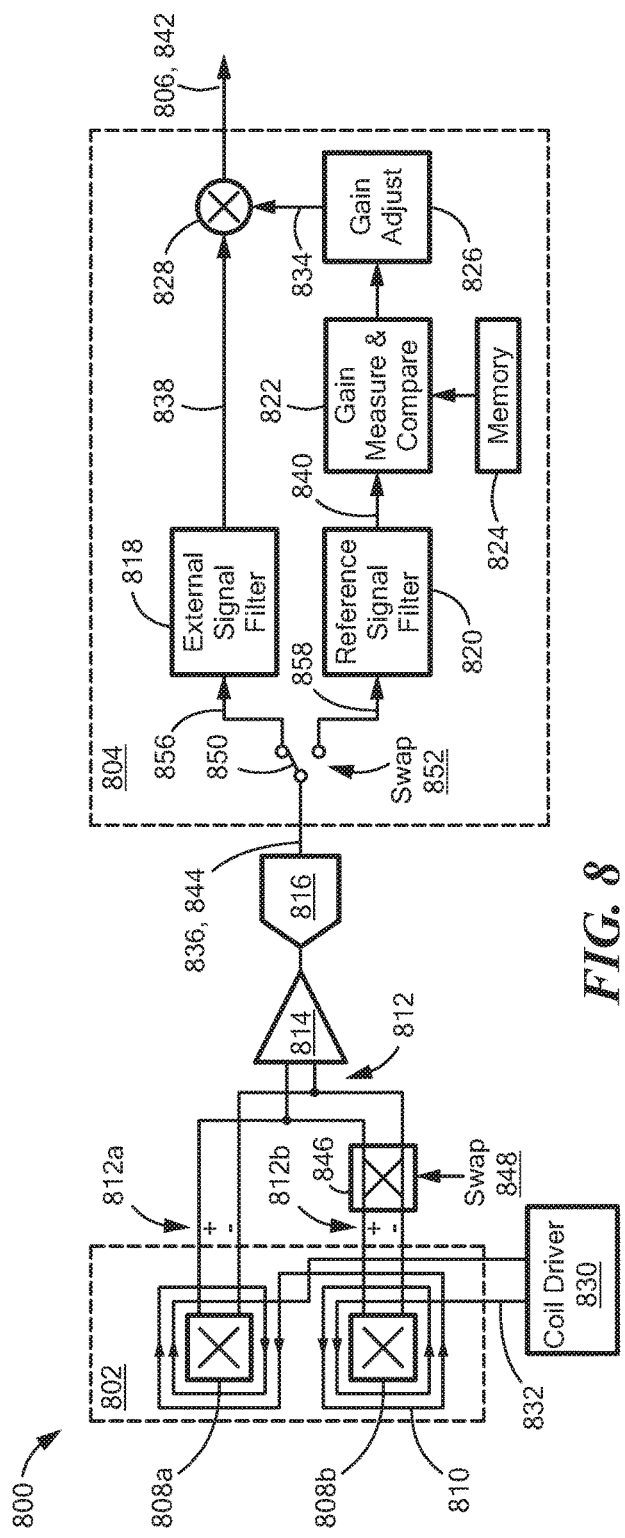
FIG. 8 is a block diagram of a magnetic field sensor that can provide gain equalization using time sharing, according to an embodiment.

Embodiments of the structures described above in conjunction with FIG. 6 can be used in conjunction with systems and circuits described in conjunction with FIGS. 4 and 8.

Figure 7:
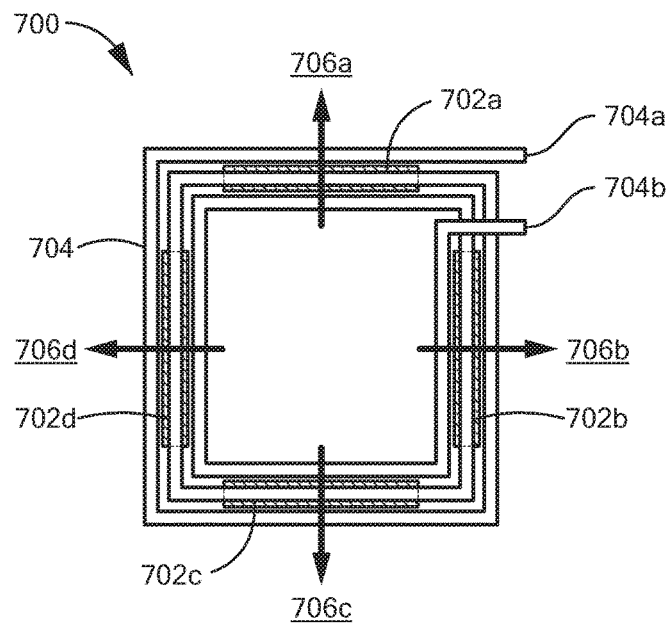
FIG. 7 is a block diagram of a structure having two differential magnetic field sensing elements and a coil structure, according to an embodiment.

Referring to FIG. 7, a structure 700 may be used for 2D magnetic field sensing, according to one embodiment. The sensor 700 may include four magnetic field sensing elements (or "sensing elements") 702a, 702b, 702c, 702d and a coil structure 704.

The four sensing elements 702a-702d may be arranged to provide two differential sensing elements in two different axes of measurement. For example, sensing elements 702a, 702c may form a first differential sensing element having a maximum response up and down the page, whereas sensing elements 702b, 702d may form a second differential sensing element having a maximum response across the page. In this arrangement, all four sensing elements 702a-702d may be provided as vertical Hall elements.

The coil structure 704 may be provided from any material and in any orientation suitable to generate magnetic fields on the sensing elements 702a-702d. In some embodiments, the coil structure 704 is provided as a continuous length of conductive material having two terminals 704a, 704b. The terminals 704a, 704b can be connected to a current source (not shown) to generate a current through the coil. In other embodiments, the coil structure 704 may be provided as multiple coils coupled in series or multiple coils coupled to different current sources.

The coil structure 704 may be configured to generate differential fields in both axes of measurement. For example, as shown in FIG. 7, the coil structure 704 may be configured to generate a first differential field 706a, 706c up and down the page, with field 706a generated on sensing element 702a and opposing field 706c generated on sensing element 702c; and a second differential field 706b, 706d across the page, with field 706b generated on sensing element 702b and opposing field 706d generated on sensing element 702d. The coil structure 704 may be wound as shown in FIG. 7 or in any other configuration capable of generating said differential fields. Positive current entering terminal 704b flows clockwise through the coil structure 704. The coil structure 704 may be positioned over the top of the sensing elements 702 and positive magnetic fields may be generated in the direction shown by arrows 706a-706d.

As explained below in conjunction with FIG. 8, using differential fields can allow external signals and reference signals to be distinguished by adding or subtracting the signals from two sensing elements having a common axis of measurement.

The magnitude of the field generated in the ith sensing element 702 may be expressed in terms of a coupling factor $C_i$, which may be determined by the geometry of the coil structure 704. In some embodiments, the multiple sensing elements 702a-702d may be fabricated on a common die using mass production techniques that reduce variance between different sensing elements. For a given structure 700 design, the ratio of the coupling factors (e.g., $C_1:C_2$) may remain generally invariant from one die to the next.

Embodiments of the structures described above in conjunction with FIG. 7 can be used in conjunction with systems and circuits described in conjunction with FIGS. 4 and 8.

Figure 7A:
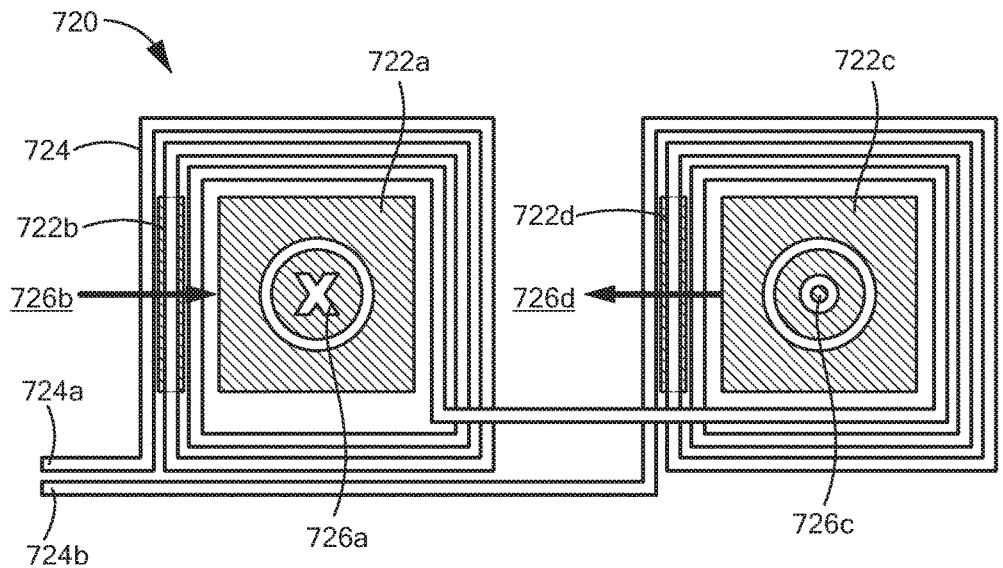
FIG. 7A is a block diagram of a structure having two differential magnetic field sensing elements and a coil structure, according to another embodiment.

Referring to FIG. 7A, a structure 720 may be used for 2D magnetic field sensing, according to another embodiment. The structure 720 may include four magnetic field sensing elements (or "sensing elements") 722a, 722b, 722c, 722d and a coil structure 724.

The four sensing elements 722a-722d may be arranged to provide two differential sensing elements in two different axes of measurement. For example, sensing elements 722a, 722c may form a first differential sensing element having a maximum response perpendicular to the page, whereas sensing elements 722b, 722d may form a second differential sensing element having a maximum response across the page. In this arrangement, sensing elements 722a, 722c may be provided as planar Hall elements, whereas sensing elements 722b, 722d may be provided as vertical Hall elements.

The coil structure 724 may be provided from any material and in any orientation suitable to generate magnetic fields on the sensing elements 722a-722d. In some embodiments, the coil structure 724 is provided as a continuous length of conductive material having two terminals 724a, 724b. The terminals 724a, 724b can be connected to a current source (not shown) to generate a current through the coil. In other embodiments, the coil structure 724 may be provided as multiple coils coupled in series or multiple coils coupled to different current sources.

The coil structure 724 may be configured to generate differential fields in both axes of measurement. For example, as shown in FIG. 7A, the coil structure 724 may be configured to generate a first differential field 726a, 726c perpendicular to the page, with field 726a generated on sensing element 722a and opposing field 726c generated on sensing element 722c; and a second differential field 726b, 726d across the page, with field 726b generated on sensing element 722b and opposing field 726d generated on sensing element 722d. The coil structure 724 may be wound as shown in FIG. 7A or in any other configuration capable of generating the differential fields.

Positive current entering terminal 724b flows clockwise around sensing element 722c and counterclockwise around hall element 726a. The coil structure 724 may be positioned over the top of the sensing elements 722 and positive magnetic fields may be generated in the direction shown by arrows 726b, 726d, in the direction going into the page as shown by "X" 726a, and in the direction coming out of the page as shown by circle 726c.

As explained below in conjunction with FIG. 8, using differential fields can allow external signals and reference signals to be distinguished by adding or subtracting the signals from two sensing elements having a common axis of measurement.

The magnitude of the field generated in the ith sensing element 722 may be expressed in terms of a coupling factor $C_i$, which may be determined by the geometry of the coil structure 724. In some embodiments, the multiple sensing elements 722a-722d may be fabricated on a common die using mass production techniques that reduce variance between different sensing elements. For a given structure 720 design, the ratio of the coupling factors (e.g., $C_1:C_2$) may remain generally invariant from one die to the next.

Embodiments of the structures described above in conjunction with FIG. 7A can be used in conjunction with systems and circuits described in conjunction with FIGS. 4 and 8.

FIG. 8 shows a magnetic field sensor 800 that can provide gain equalization using time sharing (sometimes also referred to as "time-division multiplexing" or "TDM"), according to an embodiment of the disclosure. The sensor 800 may include a structure 802 for (N-dimensional) magnetic field sensing, a gain equalization circuit 804, and a plurality (N) of outputs 806. The magnetic field sensor 800 may further include a coil driver 830 coupled to the coil structure 810.

The structure 802 may include a plurality (N) of differential magnetic field sensing elements, a coil structure 810, and a sensing element output 812. Each of the differential sensing elements (generally denoted 808 hereinafter) may be formed from a pair of sensing elements 808a, 808b having a common axis of measurement. The coil structure 810 may be configured to generate differential reference fields on each of the differential sensing elements 808. In some embodiments, N=3 and the structure 802 may be the same as or similar to embodiments of the structure 610 shown in FIG. 6 and described above in conjunction therewith. In other embodiments, N=2 and the structure 802 may be the same as or similar to embodiments of the structures 700, 720 shown in FIGS. 7, 7A and described above in conjunction therewith.

The gain equalization circuit 804 may include a plurality (N) of inputs 836 each coupled to a respective sensing element output 812. A given differential sensing element 808 may be coupled to the gain equalization circuit 804 via a signal path comprising one or more circuit elements. In the illustrated embodiment, each such signal paths may include a front-end (FE) amplifier 814.

In one embodiment, a swap signal (e.g., signal 848) may be used to change the gain of the FE amplifier 814. This approach may provide better amplification of the reference signal and/or to avoid saturating other circuitry.

In some embodiments, the gain equalization circuit 804 may process digital signals (e.g., 16-bit digital signals) and, thus, the sensor 800 may include a plurality (N) of analog-to-digital converters (ADC) 816 to convert analog sensing element output signals to digital signals.

The gain equalization circuit 804 may further include a plurality (N) of 2-way signal select switches 850 each having an input coupled to an input of a respective one of the circuit inputs 836; a plurality (N) of external signal filters 818 each having an input coupled to a first output of a respective signal select switch 850; a plurality (N) of reference signal filters 820 each also having an input coupled to a second output of a respective signal select switch 850; a gain measurement and comparison processor (or "measurement-comparison processor") 822 having a plurality of inputs coupled to respective ones of the plurality of reference signal filter 820 outputs; a memory 824 accessible by the measurement-comparison processor 822; a gain adjustment processor 826 having an input coupled to an output of the measurement-comparison processor 822; and a plurality (N) of multipliers 828 each having an first input coupled to an output of a respective external signal filter 818, a second input coupled to an output of the gain adjustment processor 826, and an output coupled to a respective circuit output 806.

For clarity in the drawing, only one differential sensing element 808, one differential output switch 846, one amplifier 814, one ADC 816, one signal select switch 850, one external signal filter 818, one reference signal filter 820, and one multiplier 828 are shown. Thus, the illustrated differential magnetic field sensing element 808 may represent a sensing element along a single axis of measurement, and the other components 846, 814, 816, 818, 820, 828 may be coupled to process output from that single sensing element 808. It should be understood that, in general, the sensor 800 may include a plurality (N) of sensing elements 808 (one for each axis of measurement) and a respective plurality of each of the components 846, 814, 816, 818, 820, 828.

In some embodiments, measurement-comparison processor 822 may be the same as or similar to embodiments of the measurement-comparison processor 414 described above in conjunction with FIG. 4. In certain embodiments, gain adjustment processor 826 may be the same as or similar to embodiments of the gain adjustment processor 418 described above in conjunction with FIG. 4. In some embodiments, memory 824 may be configured the same as or similar to memory 412 as described above in conjunction with FIG. 4.

The coil driver 830 may be configured to generate a coil drive signal 832 through the coil structure 810 to generate a differential reference field on each of differential sensing element 808. Thus, in each axis of measurement, two sensing elements 808a, 808b may generate opposite responses to a differential reference field and similar (or identical) responses to external fields. In some embodiments, the coil driver signal 832 may generate the coil drive signal 832 as a DC signal.

As shown, each of the differential sensing elements 808 may have two outputs 812a, 812b. The two outputs 812a, 812b may be coupled together in one or more different configurations to provide a single sensing element output 812. In some embodiments, the sensor 800 may include a differential output switch 846 operable to alternately couple the sensing element outputs 812a, 812b in multiple different configurations.

Figure 8A:
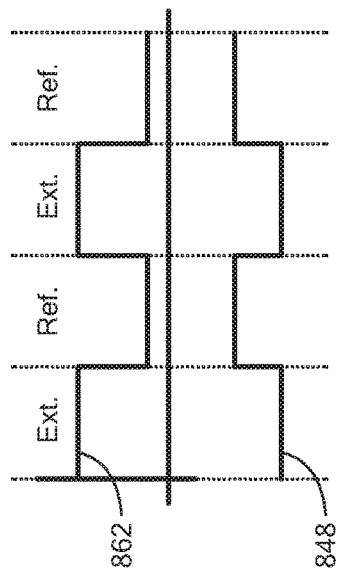
FIG. 8A are waveform diagrams of illustrative signals that may be generated and/or processed by the magnetic field sensor of FIG. 8.

Referring to FIG. 8A, in various embodiments, the sensor 800 may use time sharing to distinguish between reference signals and external signals. The differential output switch 846 may receive a logic signal ("swap signal") 848 to select between the two different configurations.

When the swap signal 848 is in a first state (e.g., low or zero), a positive terminal of a first output 812a may be coupled to a positive terminal of a second output 812b. In this configuration, the sensing element output 812 may be responsive to external fields but not the differential reference field generated by the coil structure 810. In particular, an external field may cause a similar (or identical) response in both sensing elements 808a, 808b that may be averaged, whereas the differential reference field will cause opposite responses that may cancel out.

When the swap signal 848 is in a second state (e.g., high or non-zero), a positive terminal of a first output 812a may be coupled to a negative terminal of a second output 812b. In this second configuration, the sensing element output 812 may be responsive to the differential reference field but not external fields. Here, the similar (or identical) external responses will cancel out, whereas the opposite reference field responses will be averaged.

Thus, as illustrated in FIG. 8A, a sensing element output signal 862 (which may be the same as or similar to signal 812 in FIG. 8) may be responsive to external fields during some time periods and responsive to reference fields during other time periods.

Referring again to FIG. 8, each of the sensing element output signals 812 may be amplified and digitized to generate digital sensing element output signals 844 as input to the gain equalization circuit 804. A signal select switch 850 may be configured to alternately pass a digital sensing element output signal 844 to either the external signal filter 818 or the reference signal filter 820. In some embodiments, the signal select switch 850 may be configured to receive a logic signal ("swap signal") 852 that selects between the first and second outputs. In some embodiments, the same swap signal 848, 852 may be used to control both the differential output switch 846 and the signal select switch 850. In other embodiments, swap signals 848, 852 may be synchronized such that the switches 846, 850 change state at generally the same times.

The external signal filter 818 and reference signal filter 820 may include filters to process external signals 838 and reference signals 840, respectively, in the presence of noise. In some embodiments, filters 818, 820 may be provided as decimation lowpass finite impulse response (FIR) filters.

The measurement-comparison processor 822 may be configured to calculate gain adjustment values $K_1, K_2, \ldots, K_N$ using measurements of reference signals 840, and using reference gains stored within memory 824. In some embodiments, the measurement-comparison processor 822 may utilize techniques described above in conjunction with measurement-comparison processor 414 of FIG. 4 to calculate gain adjustment values $K_1, K_2, \ldots, K_N$.

The gain adjustment processor 826 may be configured to generate a gain adjustment signal 834 based a respective one of the gain adjustment values $K_1, K_2, \ldots, K_N$. The multiplier 828 may be configured to scale the external signal 838 by the gain adjustment signal 834 to generate a gain-adjusted external signal 842.

While embodiments of the sensor 800 shown in FIG. 8 and described herein may include an analog portion and a digital portion, it will be appreciated that the particular delineation of which circuit functions are implemented in an analog fashion or with digital circuitry and signals can be varied. Further, some of the described circuit functions can be implemented on an integrated circuit and other circuitry and functionality can be implemented on separate circuits (e.g., additional substrates within the same integrated circuit package, or additional integrated circuit packages, and/or on circuit boards).

Figure 9:
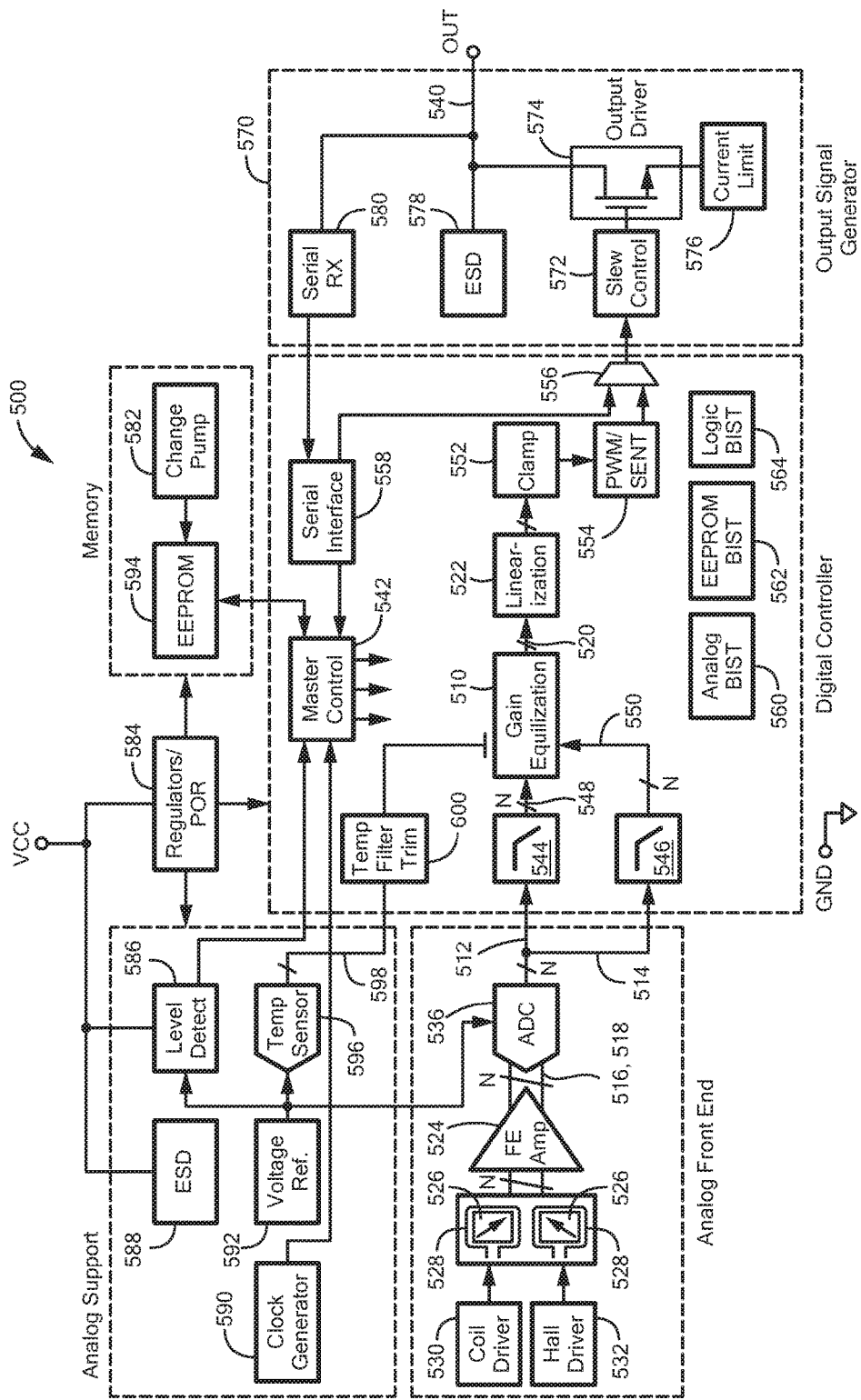
FIG. 9 is a circuit diagram of a magnetic field sensor, according to an embodiment.

Referring to FIG. 9, a magnetic field sensor 500 may include a gain equalization circuit 510 that is responsive to a plurality (N) of digital external magnetic field signals 512 and to a plurality (N) of digital reference magnetic field signals (or "reference signals") 514 to generate a plurality (N) of gain-adjusted external signals 520. The gains of the gain-adjusted external signals 520 may be equalized according to reference gains stored in memory. The gain-adjusted external signals 520 may be further processed to generate one or more output signals 540 of the sensor that are indicative of the external magnetic field.

The digital external field signal 512 and the reference magnetic field signal 514 can be the same as or similar to signals 856 and 858 shown in FIG. 8 and, thus, can be generated by switching between an external mode of operation in which an external magnetic field signal 516 is generated by magnetic field sensing elements 526, such as the illustrated Hall effect elements, under the control of a Hall driver 532 and a reference mode of operation in which a reference magnetic field signal 518 is generated by a coil structure 528 under the control of a coil driver 530. The coil structure 528 may be configured to carry a reference current to generate the reference magnetic field. At least one, and in the illustrated embodiment two, magnetic field sensing elements 526 are thus configurable to generate the external magnetic field signal 516 during a first time period and to generate the reference magnetic field signal 518 during a second, non-overlapping time period. In some embodiments, the sensing elements 526 may be provided as differential magnetic field sensing elements.

The external magnetic field signal and the reference magnetic field signal may be processed by a Front End (FE) amplifier 524 and converted into respective digital signals 512, 514 by an ADC 536 using a fixed reference from a voltage reference 592. In some embodiments, amplifier 524 may be the same as or similar to amplifier 814 in FIG. 8. In certain embodiments, ADC 536 may be the same as or similar to ADC 816 in FIG. 8.

The digital external magnetic field signal 512 may be filtered by a filter 544 to provide a filtered digital external magnetic field signal 548 (referred to herein alternatively as the digital external magnetic field signal) and the digital reference magnetic field signal 514 is filtered by a filter 546 to provide a filtered reference magnetic field signal 550 (referred to herein alternatively as the digital reference magnetic field signal). In general, the digital external magnetic field signal 512 may have a larger amplitude than the digital reference magnetic field signal 514 and thus, filter 546 may provide a higher degree of filtering than filter 544 to more accurately distinguish the reference magnetic field signal in the presence of noise. Various types of filters are possible. As one example, each of the filters 544, 546 is a low pass FIR filter with optional decimation. IIR filters could also be used.

The gain equalization circuit 510 may be configured to combine the digital external magnetic field signal 548 and the digital reference magnetic field signal 550 in a manner that generates a plurality (N) of gain-adjusted external signals 520 having relative gains (or, in some cases, absolute gain) that are generally invariant. In some embodiments, gain equalization circuit 510 may be the same as or similar to gain equalization circuit 804 described above in conjunction with FIG. 8. Operation of the gain equalization circuit 510 may be controlled by a master control circuit 542, which additionally may control various other circuit functionality.

A gain-adjusted external signal 520 may be processed by a linearization circuit 522 in certain applications. As one example, the gain-adjusted external signal 520 may be transformed into a signal representative of a position of a target by correlating values of the gain-adjusted external signal 520 to values stored in a lookup table. The output of the linearization circuit 522 may be clamped by a clamp 552 to limit the output to a programmable range and further processed by a PWM/SENT encoder circuit 554 to generate a signal having a PWM format with a programmable frequency or a SENT signal format. A multiplexer 556 can be used to select between providing the output of the PWM/SENT circuit 554 or an output of a serial interface circuit 558 to an output signal generator 570.

Additional elements of the sensor 500 can include an analog Built-in-Self-Test (BIST) circuit 560 as may implement the above-described techniques for diagnostic signal processing to detect errors in the analog front end of the sensor, an EEPROM BIST circuit 562 to test the EEPROM 594, and a logic BIST circuit 564 to test various logic functionality within the sensor 500.

The output signal generator 570 may be coupled to the multiplexer 556 and includes various elements used to reliably generate the sensor output signal 540 indicative of the external magnetic field, such as a slew control circuit 572, an output driver 574, a current limit circuit 576, an ESD protection device 578, and a serial Receiver (RX) circuit 580. In applications in which the output signal 540 is provided in the SENT signal format, the serial receiver 580 may implement bidirectional communication. The sensor 500 may include additional supporting elements such as an EEPROM 594, a charge pump 582, a regulator and Power On Reset (POR) circuit 584, a level detector 586, an ESD protection device 588 and a clock generator 590.

A temperature sensor 596 may be provided to sense the ambient temperature to which the sensor 500 is subjected, convert the sensed temperature into a digital signal, and provide the digital sensed temperature signal 598 to a temperature filter and trim circuit 600 for further coupling to the gain equalization circuit 510. In some embodiments, the temperature sensor 596 could be used for trimming over temperature. For example, if the current source drifts over temperature, the temperature sensor can be used to "flatten" drift. In other embodiments, the sensitivity of a sensing element can be trimmed over temperature using the temperature sensor 596.

While embodiments of the sensor 500 shown in FIG. 9 and described herein may include an analog front end portion and a digital portion, it will be appreciated that the particular delineation of which circuit functions are implemented in an analog fashion or with digital circuitry and signals can be varied. Further, some of the described circuit functions can be implemented on an integrated circuit and other circuitry and functionality can be implemented on separate circuits (e.g., additional substrates within the same integrated circuit package, or additional integrated circuit packages, and/or on circuit boards).

While the embodiment shown in FIG. 9 includes a differential analog front end (and thus is equated to use with the embodiment of FIG. 8), the remainder of the circuitry shown in FIG. 9 could be used with other embodiments described herein. For example, the analog front end shown in FIG. 9 could be swapped with that shown in FIG. 5.

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A magnetic field sensor comprising:
   a plurality of magnetic field sensing elements including:
   a first magnetic field sensing element arranged to have a maximum response to an external magnetic field and a reference magnetic field along a first axis and having an output that provides a first signal representing the magnetic fields as detected by the first magnetic field sensing element; and
   a second magnetic field sensing element arranged to have a maximum response to the external magnetic field and the reference magnetic field along a second axis and having an output that provides a second signal representing the magnetic field as detected by the second magnetic field sensing element;
   a coil structure configured to generate the reference magnetic field when a current passes through the coil structure;
   a memory containing at least one reference gain value comprising a relative gain between the first and second magnetic field sensing elements;
   a gain equalization circuit coupled to receive the first signal and the second signal and configured to:
   extract a first reference portion of the first signal representing the reference field;
   extract a second reference portion of the second signal representing the reference field;
   measure a first gain of the first reference portion;
   measure a second gain of the second reference portion;
   compare the first gain to the at least one reference gain;
   compare the second gain to the at least one reference gain;

adjust the first gain based on the comparison of the first gain and the reference gain value so that the first gain is normalized to an expected value; and adjust the second gain based on the comparison of the second gain and the reference gain value so that the second gain is normalized to the expected value.

2. The structure of claim 1 wherein the first and second magnetic field sensing elements comprise vertical Hall effect elements.

3. The structure of claim 1 wherein the first magnetic field sensing element comprises a planar Hall effect element and the second magnetic field sensing element comprises a vertical Hall effect element.

4. The structure of claim 1 wherein the plurality of magnetic field sensing elements further includes a third magnetic field sensing element arranged to have a maximum response to the magnetic field along a third axis.

5. The structure of claim 4 wherein the first magnetic field sensing element comprises a planar Hall effect element, and the second and third magnetic field sensing elements comprise vertical Hall effect elements.

6. The structure of claim 1 wherein at least one of the plurality of magnetic field sensing elements comprises a magnetoresistance element.

7. The structure of claim 1 wherein the first magnetic field sensing element comprises a first differential magnetic field sensing element and the second magnetic field sensing element comprises a second differential magnetic field sensing element, wherein the coil structure is configured to generate differential magnetic fields on the first and second differential magnetic field sensing elements.

8. The structure of claim 7 wherein the first differential magnetic field sensing element comprises two vertical Hall elements and the second differential magnetic field sensing element comprises two vertical Hall elements.

9. The structure of claim 7 wherein the first differential magnetic field sensing element comprises two planar Hall elements and the second differential magnetic field sensing element comprises two vertical Hall elements.

10. The structure of claim 7 wherein the plurality of magnetic field sensing elements further includes a third magnetic field sensing element arranged to have a maximum response to the magnetic field along a third axis, wherein the third magnetic field sensing element comprises a third differential magnetic field sensing element.

11. The structure of claim 10 wherein the first differential magnetic field sensing element comprises two planar Hall effect elements, the second differential magnetic field sensing element comprises two vertical Hall effect elements, and the third differential magnetic field sensing element comprises two vertical Hall effect elements.

12. The structure of claim 11 wherein the coil structure comprises windings a first direction around the a first one of the two planar Hall effect elements and windings in a second opposite direction around a second one of the two planar Hall effect elements.

13. The magnetic field sensor of claim 11 further comprising a coil driver circuit coupled to the coil structure;

wherein the coil driver circuit is configured to generate a coil drive signal as an alternating current (AC) signal having a frequency substantially different than a frequency of the external magnetic field, and the first, second, and third signals represent; and wherein the gain equalization circuit comprises:

an external signal filter to extract a portion of the first and second signals representing the external magnetic field; and a reference signal filter to extract the first and second reference portions.

14. The structure of claim 1 wherein the coil structure comprises a continuous length of conductive material.

15. The structure of claim 1 wherein the coil structure comprises multiple coils each configured to generate a magnetic field on one or more of the magnetic field sensing elements when a current passes through the coil, wherein the currents passing through the multiple coils are matched.

16. The structure of claim 15 wherein the multiple coils are coupled in series.

17. The structure of claim 1 wherein the coil structure is configured to generate a first magnetic field substantially parallel to the first axis and a second magnetic field substantially parallel to the second axis.

18. The magnetic field sensor of claim 1 wherein the reference gain value comprises a ratio of an absolute gain associated with the first magnetic field sensing element and an absolute gain associated with the second magnetic field sensing element.

19. The magnetic field sensor of claim 1 wherein the coil structure comprises multiple coils coupled to a coil driver circuit so that each of the multiple coils receives a current of the same magnitude.

* * * * *

UNITED STATES PATENT AND TRADEMARK OFFICE
CERTIFICATE OF CORRECTION

PATENT NO. : 10,132,879 B2
APPLICATION NO. : 15/161553
DATED : November 20, 2018
INVENTOR(S) : Alexander Latham et al.

It is certified that error appears in the above-identified patent and that said Letters Patent is hereby corrected as shown below:

In the Specification

Column 7, Line 67, replace "ith" with --$i^{th}$--

Column 8, Line 3, replace "ith" with --$i^{th}$--

Column 8, Line 63, replace "ith" with --$i^{th}$--

Column 9, Line 54, replace "ith" with --$i^{th}$--

Column 13, Line 62, replace "ith" with --$i^{th}$--

Column 15, Line 5, replace "an first" with --a first--

Column 17, Line 53, replace "ith" with --$i^{th}$--

Column 18, Line 44, replace "ith" with --$i^{th}$--

Column 19, Line 41, replace "ith" with --$i^{th}$--

Column 20, Line 44, replace "an first" with --a first--

Column 24, Line 6, replace "front end" with --front-end--

Signed and Sealed this
Twenty-second Day of January, 2019

Andrei Iancu
*Director of the United States Patent and Trademark Office*